(12) United States Patent
Hayashi et al.

(10) Patent No.: US 6,493,195 B1
(45) Date of Patent: Dec. 10, 2002

(54) MAGNETORESISTANCE ELEMENT, WITH LOWER ELECTRODE ANTI-EROSION/FLAKING LAYER

(75) Inventors: Kazuhiko Hayashi, Tokyo (JP); Keishi Ohashi, Tokyo (JP); Nobuyuki Ishiwata, Tokyo (JP); Masafumi Nakada, Tokyo (JP); Eizo Fukami, Tokyo (JP); Hiroaki Honjo, Tokyo (JP); Hisanao Tsuge, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 97 days.

(21) Appl. No.: 09/651,068

(22) Filed: Aug. 30, 2000

(30) Foreign Application Priority Data

Sep. 1, 1999 (JP) ............................................. 11-247201

(51) Int. Cl.$^7$ ............................. G11B 5/127; G11B 5/39
(52) U.S. Cl. ....................................... 360/322; 360/320
(58) Field of Search ................................ 360/322, 119, 360/320, 313, 110, 324, 324.1, 324.2

(56) References Cited

U.S. PATENT DOCUMENTS

| 5,898,547 A | * | 4/1999 | Fontana et al. | 360/321 |
| 5,898,548 A | * | 4/1999 | Dill et al. | 360/319 |
| 5,901,018 A | * | 5/1999 | Fontana et al. | 360/324.2 |
| 6,341,053 B1 | * | 1/2002 | Nakada et al. | 360/324.2 |

FOREIGN PATENT DOCUMENTS

| JP | 8-21166 | 3/1996 |
| JP | 2651015 | 5/1997 |
| JP | 2725987 | 12/1997 |
| JP | 10-162327 | 6/1998 |

OTHER PUBLICATIONS

Thompson et al., "Memory, Storage and Related Applications", Jul. 1975, *IEEE Transactions on Magnetics*, vol. MAG–11, No. 4, pp. 1039–1050.

* cited by examiner

*Primary Examiner*—Hoa T. Nguyen
*Assistant Examiner*—Julie Anne Watko
(74) *Attorney, Agent, or Firm*—Young & Thompson

(57) ABSTRACT

A magnetoresistance element includes a lower electrode layer, a magnetoresistance effect layer, an upper electrode layer and a lower electrode anti-erosion/flaking layer. The lower electrode anti-erosion/flaking layer, which is formed before a photoresist layer remaining on the patterned lower electrode layer is removed, is formed around the lower electrode layer so that its edge facing the lower electrode layer will be in contact with the edge of the lower electrode layer. By use of the lower electrode anti-erosion/flaking layer, the edge of the lower electrode layer is protected from being exposed to a release agent containing a dissolved photoresist in a photoresist layer removal step (when the photoresist layer remaining on the patterned lower electrode layer is removed), thereby the increase of roughness of the edge of the lower electrode layer due to erosion/flaking of the edge in the photoresist removal step can be avoided, and thereby electrical shorts between the upper electrode layer and the lower electrode layer can be eliminated, and thereby a magnetoresistance element of high sensitivity and high performance can be obtained and manufacturing yield of the magnetoresistance elements can be improved.

16 Claims, 21 Drawing Sheets

F I G. 12
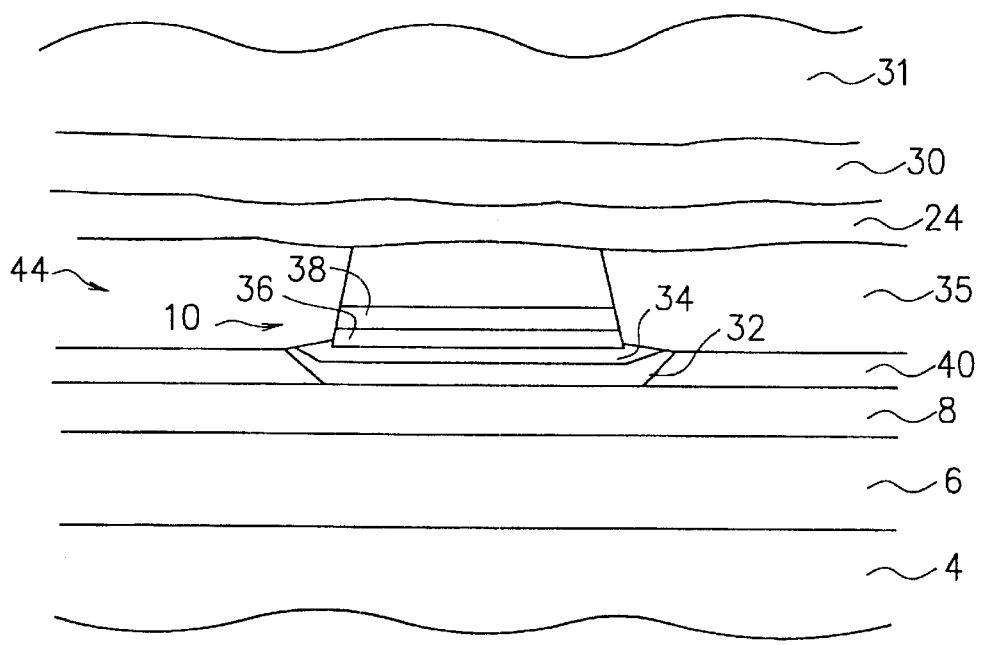

F I G. 20
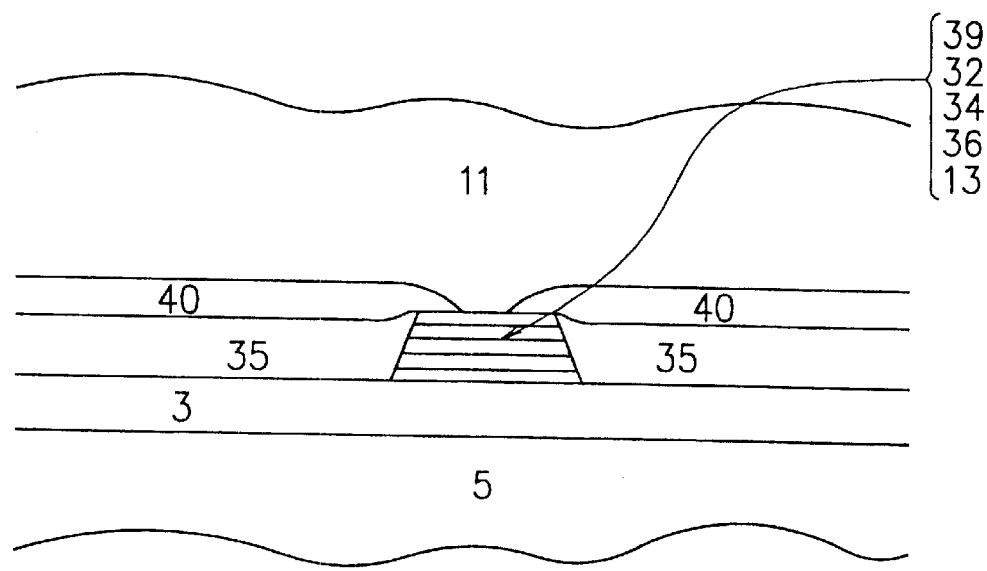

F I G. 21
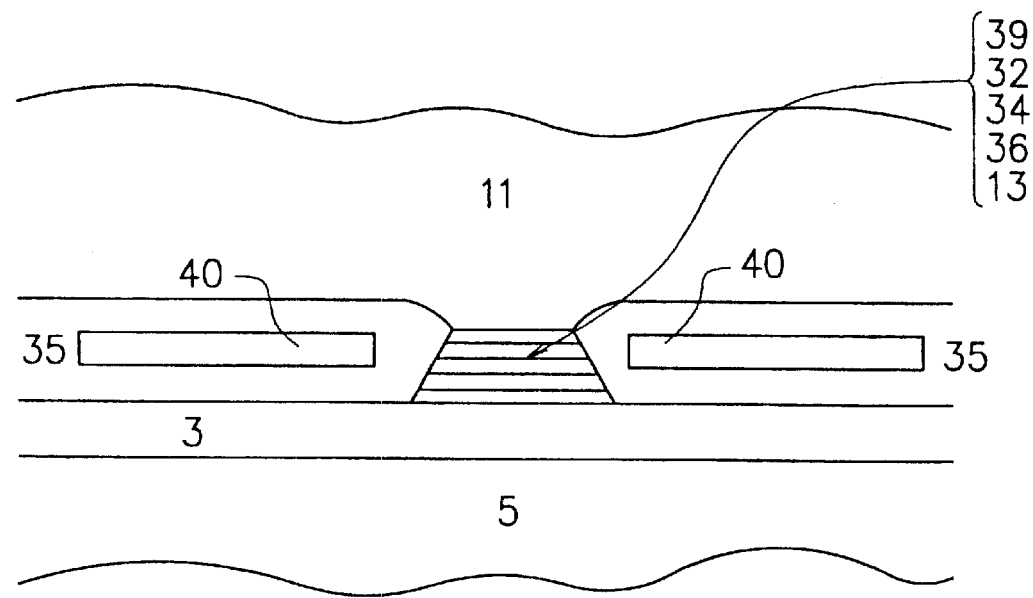

FIG. 24

| ANTI-EROSION/FLAKING LAYER MATERIAL | MANUFACTURING YIELD (%) |
|---|---|
| NONE | 4 |
| Ti | 62 |
| Cr | 63 |
| Ru | 82 |
| Pd | 83 |
| Hf | 77 |
| Ta | 73 |
| W | 62 |
| Ir | 82 |
| Pt | 86 |
| Au | 85 |
| Al OXIDE | 86 |
| Al NITRIDE | 82 |
| Si OXIDE | 81 |
| Si NITRIDE | 80 |

FIG. 25

| LOWER ELECTRODE MATERIAL | MANUFACTURING YIELD (%) |
|---|---|
| Cu | 86 |
| Au | 84 |
| Ag | 72 |
| Pt | 68 |
| Mo | 73 |
| Al | 77 |
| Ru | 85 |

MAGNETORESISTANCE ELEMENT, WITH LOWER ELECTRODE ANTI-EROSION/FLAKING LAYER

BACKGROUND OF THE INVENTION

The present invention relates to a magnetoresistance element whose electrical resistance changes depending on the magnetic field, a manufacturing method of the magnetoresistance element, a magnetic field detection system employing the magnetoresistance element, and a magnetic recording system employing the magnetic field detection system.

DESCRIPTION OF THE PRIOR ART

Magnetoresistance elements or miagnetoresistance sensors have been used for heads of HDDs (Hard Disk Drives) of computers, and the magnetoresistance element realizes readout of information which has been stored in a high-density record medium. The magnetoresistance element (magnetoresistance head) changes its electrical resistance depending on the intensity and direction of the magnetic field around it. Therefore, if a constant voltage is applied to the magnetoresistance head, current passing through the magnetoresistance head changes as the magnetic field changes (as the position of the magnetoresistance head in relation to the record medium changes), thereby the information which has been stored in the record medium can be read out as a current signal.

Concretely, the magnetoresistance element basically behaves based on the AMR (Anisotropic MagnetoResistance) effect. In the case of the AMR effect, a component of an electrical resistance vector can be expressed as:

$$R = A \cdot \cos^2 \theta$$

where θ is the angle between the direction of magnetization of the magnetoresistance element and the direction of a sense current passing through the magnetoresistance element. With regard to the AMR effect, a detailed description has been given in a document: D. A. Thompson et al. "Memory, Storage and Related Applications", IEEE Trans. on Mag. MAG-11, Page 1039 (1975).

In a magnetoresistance sensor employing the AMR effect, the so-called Barkhausen noise occurs. In order to reduce the Barkhausen noise, a longitudinal bias magnetic field is generally applied to the magnetoresistance sensor. The application of the longitudinal bias magnetic field is usually implemented by antiferromagnetic material such as FeMn, NiMn, Ni oxide, etc. Incidentally, the "FeMn" and "NiMn" are chemical symbols, and hereafter, such chemical symbols will be used for the sake of brevity of expression.

In recent years, new types of magnetoresistance effects which are called "giant magnetoresistance effect", "spin valve effect", etc. have been reported and have attracted considerable attention. Such effects, which are stronger than the conventional AMR effect, can be observed in an artificial lattice which is composed of ferromagnetic layers and non-magnetic conduction layers which are stacked alternately. The behavior of electrical resistance of such an artificial lattice has been explained from the viewpoint of spin-dependent transfer of conduction electrons between the ferromagnetic layers through the non-magnetic conduction layers, or spin-dependent scattering of the conduction electrons at the interfaces between the layers. In a magnetoresistance sensor composed of such an artificial lattice, an in-plane resistance of a pair of ferromagnetic layers separated by a non-magnetic conduction layer changes as:

$$R = B \cdot \cos \phi$$

where φ is the angle between magnetization directions of the two ferromagnetic layers. The magnetoresistance sensor employing the giant magnetoresistance effect of such an artificial lattice is more highly sensitive (larger ΔR) than the magnetoresistance sensors employing the AMR effect.

In Japanese Patent Application Laid-Open No.HEI2-61572 (Japanese Gazette Containing the Patent No.2651015), a layered magnetic structure which exhibits a large magnetoresistance effect due to anti-parallel magnetization directions between magnetic layers has been disclosed. The layered structure is composed of a first permalloy layer, a second permalloy layer, an interlayer between the two permalloy layers, and a pinning (fixing) layer below the second permalloy layer. The two permalloy layers having opposite magnetization directions are separated by the interlayer (5 nm Au layer, for example), and the magnetization of the second permalloy layer is pinned (fixed) by the pinning layer which is preferably implemented by an FeMn layer.

In Japanese Patent Application Laid-Open No.HEI4-358310 (Japanese Publication of Examined Patent Applications No.HEI8-21166) and Japanese Patent Application Laid-Open No.HEI6-203340 (Japanese Gazette Containing the Patent No.2725987), a layered magnetic structure named "spin valve" has been disclosed. The layered magnetic structure includes a first ferromagnetic layer (soft), a second ferromagnetic layer and a non-magnetic metal layer which separates the two ferromagnetic layers. The angle between the magnetization directions of the two ferromagnetic layers is 90 degrees when a magnetic field applied thereto is 0, and the in-plane electrical resistance of the non-coupled two ferromagnetic layers separated by the non-magnetic metal layer changes proportionally to the aforementioned "cos φ" (where φ is the angle between magnetization directions of the two ferromagnetic layers), independently of the direction of the sense current passing through the spin valve magnetoresistance sensor.

A magnetoresistance sensor employing a ferromagnetic tunnel junction has been disclosed in Japanese Patent Application Laid-Open No.HEI10-162327.

FIG. 1 is a vertical sectional view showing an example of a conventional magnetoresistance element which is employed as a magnetoresistance sensor. Referring to the magnetoresistance element 102 shown in FIG. 1, a lower gap layer 106 is formed on a lower shield layer 104 which is formed on an unshown substrate, and a lower electrode layer 108 is formed on the lower gap layer 106. A magnetoresistance effect layer 110 is formed on the lower electrode layer 108, and a upper electrode layer 112 is formed on the magnetoresistance effect layer 110. The upper electrode layer 112 is composed of a first upper electrode layer 114 and a second upper electrode layer 116. The first upper electrode layer 114 is formed directly on the magnetoresistance effect layer 110 so as to cover the magnetoresistance effect layer 110, and the second upper is electrode layer 116 is formed on the first upper electrode layer 114. An upper gap layer 113 is formed on the upper electrode layer 112, and an upper shield layer 115 is formed on the upper gap layer 113.

The surface 118 on the left-hand end of the structure shown in FIG. 1 is the so-called ABS (Air Bearing Surface). When information stored in a magnetic recording medium is read out by the magnetoresistance element 102, the magnetoresistance element 102 is positioned so that the ABS 118 will face the surface of the magnetic recording medium and a narrow gap will be formed between the ABS 118 and the surface.

In the manufacturing process of the magnetoresistance element 102, the lower electrode layer 108 is generally formed by the following process (1) or (2).

(1) An electrode layer to be formed as the lower electrode layer 108 is deposited on the entire surface of the lower gap layer 106, and a photoresist layer (pattern) is formed on the electrode layer. Subsequently, unnecessary part of the electrode layer is removed by means of milling so that the lower electrode layer 108 will be patterned to a predetermined shape. Thereafter, the photoresist layer remaining on the patterned lower electrode layer 108 is removed by use of a release agent.

(2) A photoresist layer for lift-off is formed on part of the surface of the lower gap layer 106, and an electrode layer to be formed as the lower electrode layer 108 is deposited on the photoresist layer and the lower gap layer 106. Thereafter, the photoresist layer is removed by use of a release agent (lift-off).

FIG. 2 is a vertical sectional view showing a stage in the above process (1) just after the step for patterning the lower electrode layer 108. After the patterning step, the photoresist layer 120 remaining on the patterned lower electrode layer 108 is removed by use of a release agent.

However, in the above photoresist layer removing step, the edge 122 of the lower electrode layer 108 is exposed to the release agent in which the photoresist has been dissolved, thereby the edge 122 of the lower electrode layer 108 is eroded or flakes off due to the release agent containing the dissolved photoresist. Consequently, there are cases where the roughness of the edge 122 of the lower electrode layer 108 is increased to as large as hundreds of nanometers.

Also in the case of the process (2), when the photoresist for lift-off is removed by use of the release agent, the edge 122 of the lower electrode layer 108 is similarly exposed to the release agent containing the dissolved photoresist, thereby the same problem as that of the process (1) occurs.

As seen in FIG. 1, above the edge 122 of the lower electrode layer 108, the second upper electrode layer 116 (which is formed on an insulation layer 124) spreads. If the roughness of the lower electrode layer edge 122 enlarges as above, an electrical short circuit between the lower electrode layer edge 122 and the second upper electrode layer 116 tends to occur and such shorts have actually been reported. The shorts seem to occurs due to curling-up of part of the lower electrode layer 108 near the edge 122, materials of the eroded/flaked lower electrode layer edge 122 which redeposited on the edge 122, etc. Due to such a short circuit, even if a sense current is passed between the upper electrode layer 112 and the lower electrode layer 108, the sense current passes through the short circuit between the electrode layers without passing through the magnetoresistance effect layer 110, thereby the detection of the magnetic field by the change of the resistance of the magnetoresistance effect layer 110 becomes difficult. Consequently, the sensitivity and performance of the magnetoresistance elements 102 manufactured by the above processes are necessitated to be deteriorated, or manufacturing yield of the magnetoresistance elements 102 is necessitated to be decreased, causing higher cost.

SUMMARY OF THE INVENTION

It is therefore the primary object of the present invention to provide a magnetoresistance element having a structure in which the shorts between the upper electrode layer and the lower electrode layer is prevented.

Another object of the present invention is to provide a manufacturing method of a magnetoresistance element by which the shorts between the upper electrode layer and the lower electrode layer of the magnetoresistance element is prevented.

Another object of the present invention is to provide a magnetoresistance magnetic field detection system (a magnetic field detection system employing a magnetoresistance element) in which the shorts between the upper electrode layer and the lower electrode layer of the magnetoresistance element is prevented and thereby high performance and low cost of the syatem are realized.

Another object of the present invention is to provide a magnetic recording system employing a magnetoresistance element in which the shorts between the upper electrode layer and the lower electrode layer of the magnetoresistance element is prevented and thereby high performance and low cost of the system are realized.

In accordance with a first aspect of the present invention, there is provided a magnetoresistance element comprising a lower electrode layer, a magnetoresistance effect layer, an upper electrode layer and a lower electrode anti-erosion/flaking layer. The lower electrode layer is formed directly on a lower shield layer or on another layer which is formed on the lower shield layer or so as to serve also as the lower shield layer. The magnetoresistance effect layer is formed on part of the upper surface of the lower electrode layer. The upper electrode layer is formed above the lower electrode layer so that part of its lower surface will at least be in contact with the upper surface of the magnetoresistance effect layer. The lower electrode anti-erosion/flaking layer is formed before a photoresist layer remaining on the patterned lower electrode layer is removed. The lower electrode anti-erosion/flaking layer is formed around the lower electrode layer so that the edge of the lower electrode anti-erosion/flaking layer facing the lower electrode layer will be in contact with the edge of the lower electrode layer.

In accordance with a second aspect of the present invention, in the first aspect, the lower electrode anti-erosion/flaking layer is formed so that its edge facing the lower electrode layer will cover the edge of the lower electrode layer.

In accordance with a third aspect of the present invention, in the first aspect, the upper electrode layer includes a first upper electrode layer and a second upper electrode layer. The first upper electrode layer is formed on the magnetoresistance effect layer in almost the same area as that of the magnetoresistance effect layer. The second upper electrode layer is formed above the lower electrode layer so that part of the lower surface of the second upper electrode layer will be in contact with the upper surface of the first upper electrode layer.

In accordance with a fourth aspect of the present invention, in the first aspect, the lower shield layer is formed on a substrate, and the lower electrode layer is formed on part of the upper surface of the lower shield layer.

In accordance with a fifth aspect of the present invention, in the first aspect, the lower shield layer also serves as the lower shield layer.

In accordance with a sixth aspect of the present invention, in the first aspect, the lower shield layer is formed on a substrate, and a lower gap layer is formed on the lower shield layer, and the lower electrode layer is formed on part of the upper surface of the lower gap layer.

In accordance with a seventh aspect of the present invention, in the first aspect, the magnetoresistance element further comprises an upper shield layer which is formed on the upper electrode layer.

In accordance with an eighth aspect of the present invention, in the first aspect, the upper electrode layer also serves as an upper shield layer.

In accordance with a ninth aspect of the present invention, in the first aspect, the magnetoresistance element further comprises an upper gap layer which is formed on the upper electrode layer, and an upper shield layer which is formed on the upper gap layer.

In accordance with a tenth aspect of the present invention, in the first aspect, the magnetoresistance element further comprises a longitudinal bias layer which is formed nearby or in contact with the magnetoresistance effect layer for applying a longitudinal bias magnetic field to the magnetoresistance effect layer.

In accordance with an eleventh aspect of the present invention, in the tenth aspect, the longitudinal bias layer is formed on the upper surface of the lower electrode layer on both sides of the magnetoresistance effect layer.

In accordance with a twelfth aspect of the present invention, in the tenth aspect, the longitudinal bias layer is formed so that its part will at least be in contact with the magnetoresistance effect layer.

In accordance with a thirteenth aspect of the present invention, in the first aspect, the lower electrode anti-erosion/flaking layer is implemented by a single layer which is composed of metal, oxide or nitride.

In accordance with a fourteenth aspect of the present invention, in the first aspect, the lower electrode anti-erosion/flaking layer is implemented by a mixture layer which is composed of a mixture of oxide and nitride.

In accordance with a fifteenth aspect of the present invention, in the first aspect, the lower electrode anti-erosion/flaking layer is implemented by multiple layers each layer of which is selected from a metal layer, an oxide layer, a nitride layer and a mixture layer composed of oxide and nitride.

In accordance with a sixteenth aspect of the present invention, in the first aspect, the magnetoresistance effect layer is composed of ferromagnetic tunnel junction layers.

In accordance with a seventeenth aspect of the present invention, in the first aspect, the magnetoresistance effect layer includes a free layer which is formed over the lower electrode layer, a non-magnetic layer which is formed over the free layer, a pinned layer which is formed over the non-magnetic layer, and a pinning layer which is formed over the pinned layer for pinning the direction of magnetization of the pinned layer.

In accordance with an eighteenth aspect of the present invention, in the first aspect, the magnetoresistance effect layer includes a free layer which is formed under the upper electrode layer, a non-magnetic layer which is formed under the free layer, a pinned layer which is formed under the non-magnetic layer, and a pinning layer which is formed under the pinned layer for pinning the direction of magnetization of the pinned layer.

In accordance with a nineteenth aspect of the present invention, there is provided a manufacturing method of a magnetoresistance element which is provided with a lower electrode layer which is formed directly on a lower shield layer or on another layer which is formed on the lower shield layer or so as to serve also as the lower shield layer, a magnetoresistance effect layer which is formed on part of the upper surface of the lower electrode layer, and an upper electrode layer which is formed above the lower electrode layer so that part of its lower surface will at least be in contact with the upper surface of the magnetoresistance effect layer. In the manufacturing method, the lower electrode layer is formed by a lower electrode layer deposition step, a photoresist layer formation step, a lower electrode layer patterning step, a lower electrode anti-erosion/flaking layer formation step and a photoresist layer removal step. In the lower electrode layer deposition step, the lower electrode layer is deposited on a certain layer. In the photoresist layer formation step, a photoresist layer is formed on the deposited lower electrode layer. In the lower electrode layer patterning step, the deposited lower electrode layer is patterned by use of the photoresist layer. In the lower electrode anti-erosion/flaking layer formation step, a lower electrode anti-erosion/flaking layer is formed around the patterned lower electrode layer so that the edge of the lower electrode anti-erosion/flaking layer facing the lower electrode layer will be in contact with the edge of the lower electrode layer. In the photoresist layer removal step, which is conducted after the lower electrode anti-erosion/flaking layer formation step, the photoresist layer remaining on the patterned lower electrode layer is removed.

In accordance with a twentieth aspect of the present invention, in the nineteenth aspect, the lower electrode anti-erosion/flaking layer is implemented by a single layer which is composed of metal, oxide or nitride.

In accordance with a twenty-first aspect of the present invention, in the nineteenth aspect, the lower electrode anti-erosion/flaking layer is implemented by a mixture layer which is composed of a mixture of oxide and nitride.

In accordance with a twenty-second aspect of the present invention, in the nineteenth aspect, the lower electrode anti-erosion/flaking layer is implemented by multiple layers each layer of which is selected from a metal layer, an oxide layer, a nitride layer and a mixture layer composed of oxide and nitride.

In accordance with a twenty-third aspect of the present invention, in the nineteenth aspect, the patterning of the deposited lower electrode layer in the lower electrode layer patterning step is conducted by milling.

In accordance with a twenty-fourth aspect of the present invention, there is provided a magnetic field detection system comprising a magnetoresistance element, a current passage means and a resistivity detection means. The magnetoresistance element includes a lower electrode layer which is formed directly on a lower shield layer or on another layer which is formed on the lower shield layer or so as to serve also as the lower shield layer, a magnetoresistance effect layer which is formed on part of the upper surface of the lower electrode layer, an upper electrode layer which is formed above the lower electrode layer so that part of its lower surface will at least be in contact with the upper surface of the magnetoresistance effect layer, and a lower electrode anti-erosion/flaking layer which is formed around the lower electrode layer before a photoresist layer remaining on the patterned lower electrode layer is removed so that the edge of the lower electrode anti-erosion/flaking layer facing the lower electrode layer will be in contact with the edge of the lower electrode layer. The current passage means passes a sense current between the upper electrode layer and the lower electrode layer of the magnetoresistance element. The resistivity detection means detects the change of resistivity of the magnetoresistance element based on the sense current passed by the current passage means between the upper electrode layer and the lower electrode layer.

In accordance with a twenty-fifth aspect of the present invention, there is provided a magnetic recording system comprising a reproduction head, a current passage means, a resistivity detection means and a driving means. The reproduction head employs a magnetoresistance element including a lower electrode layer which is formed directly on a lower shield layer or on another layer which is formed on the lower shield layer or so as to serve also as the lower shield layer, a magnetoresistance effect layer which is formed on part of the upper surface of the lower electrode layer, an upper electrode layer which is formed above the lower electrode layer so that part of its lower surface will at least be in contact with the upper surface of the magnetoresistance effect layer, and a lower electrode anti-erosion/flaking layer which is formed around the lower electrode layer before a photoresist layer remaining on the patterned lower electrode layer is removed so that the edge of the lower electrode anti-erosion/flaking layer facing the lower electrode layer will be in contact with the edge of the lower electrode layer. The current passage means passes a sense current between the upper electrode layer and the lower electrode layer of the magnetoresistance element of the reproduction head. The resistivity detection means detects the change of resistivity of the magnetoresistance element based on the sense current passed by the current passage means between the upper electrode layer and the lower electrode layer. The driving means drives the reproduction head and places the magnetoresistance element of the reproduction head on a selected track of an information storage surface of a magnetic recording medium.

In accordance with a twenty-sixth aspect of the present invention, in the twenty-fifth aspect, the magnetic recording system further comprises a recording head which is attached to the reproduction head so as to be driven by the driving means together with the reproduction head and placed on a selected track of the information storage surface of the magnetic recording medium.

BRIEF DESCRIPTION OF THE DRAWINGS

The objects and features of the present invention will become more apparent from the consideration of the following detailed description taken in conjunction with the accompanying drawings, in which:

FIGS. 11 through 21 are enlarged vertical sectional views showing other examples of magnetoresistance elements in accordance with the present invention (magnetoresistance elements to which the present invention can be applied);

FIG. 24 is a table showing the result of a manufacturing yield test of magnetoresistance elements which has been conducted by the present inventors, in which the effect of a lower electrode anti-erosion/flaking layer of the magnetoresistance element in accordance with the present invention was examined changing the material of the lower electrode anti-erosion/flaking layer; and FIG. 25 is a table showing the result of another manufacturing yield test of magnetoresistance elements which has been conducted by the present inventors, in which the material of the lower electrode layer of the magnetoresistance element in accordance with the present invention was changed.

DESCRIPTION OF THE PREFERRED EMBODIMENTS

Figure 1:
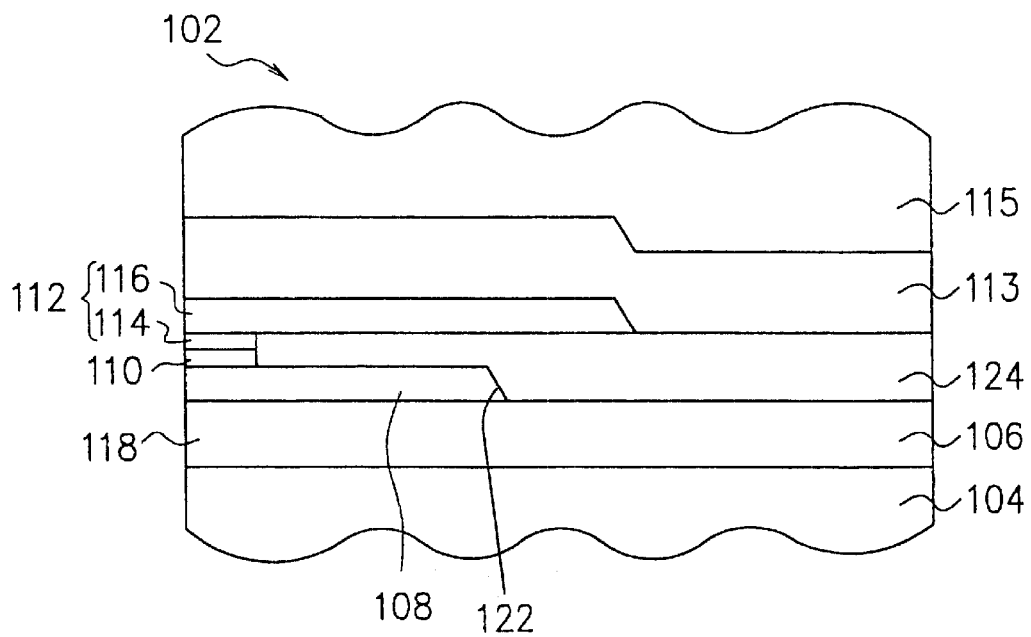
FIG. 1 is a vertical sectional view showing an example of a conventional magnetoresistance element which is employed as a magnetoresistance sensor.
Figure 2:
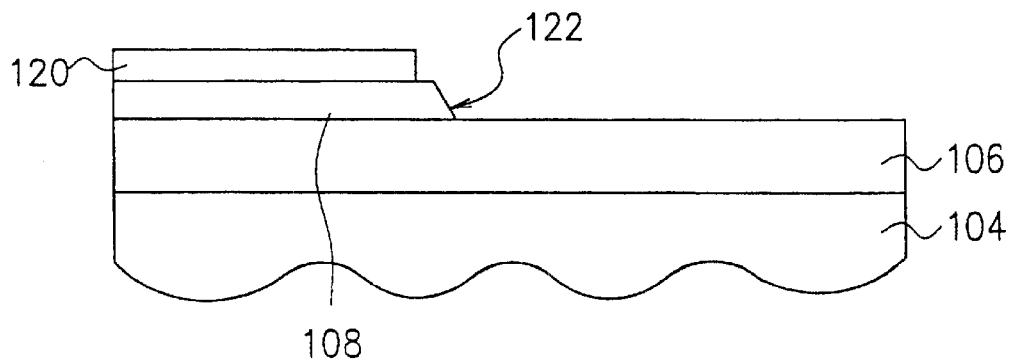
FIG. 2 is a vertical sectional view showing the status of the conventional magnetoresistance element of FIG. 1 just after a step for patterning the lower electrode layer.

Referring now to the drawings, a description will be given in detail of preferred embodiments in accordance with the present invention.

Figure 3:
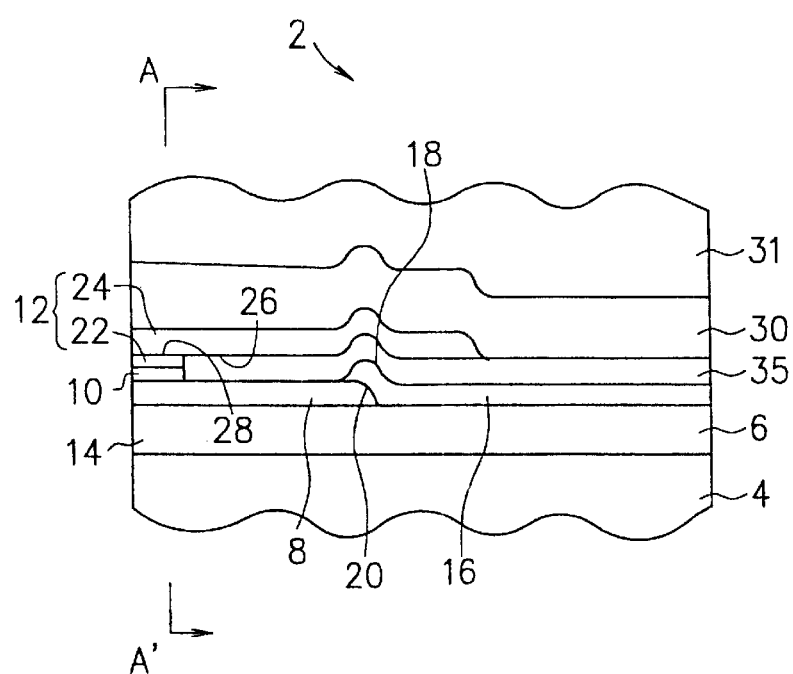
FIG. 3 is a vertical sectional view showing an example of a magnetoresistance element in accordance with an embodiment of the present invention.
Figure 4:
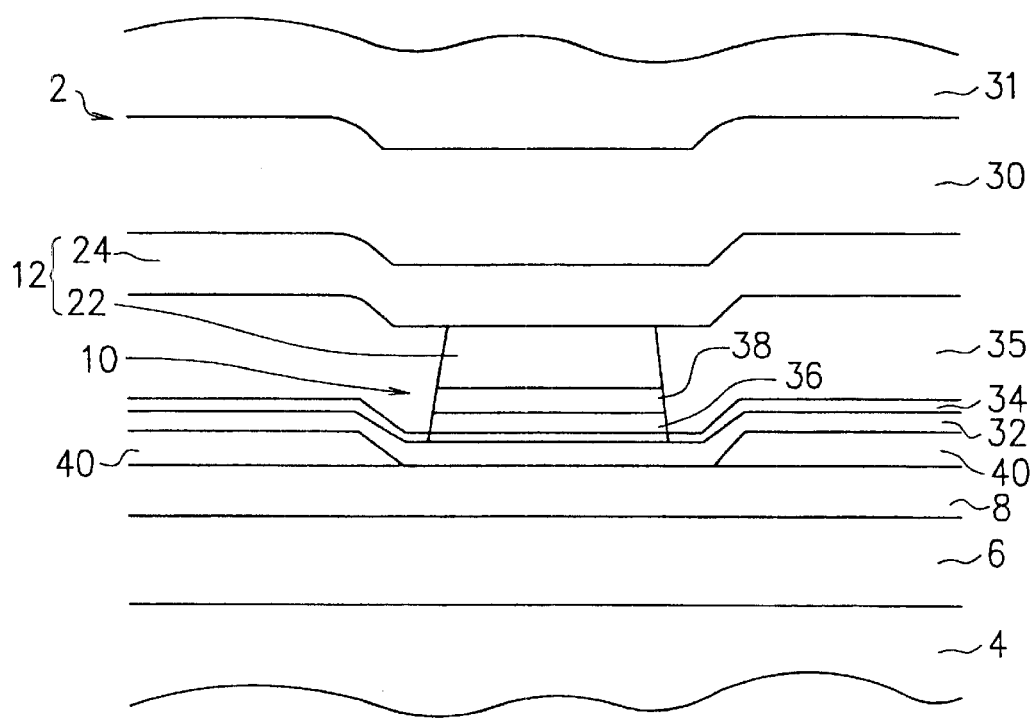
FIG. 4 is an enlarged vertical sectional view showing the detailed composition around a magnetoresistance effect layer of the magnetoresistance element of FIG. 3, taken along the line A–A' shown in FIG.3.

FIG. 3 is a vertical sectional view showing an example of a magnetoresistance element in accordance with an embodiment of the present invention. FIG. 4 is an enlarged vertical sectional view showing the detailed composition around a magnetoresistance effect layer 10 of the magnetoresistance element of FIG. 3, taken along the line A–A' shown in FIG. 3.

Referring to FIGS. 3 and 4, the magnetoresistance element 2 includes a lower shield layer 4 which is formed on an unshown substrate, a lower gap layer 6 which is formed on the lower shield layer 4, a lower electrode layer 8 which is formed on part of the lower gap layer 6, a magnetoresistance effect layer 10 which is formed on part of the lower electrode layer 8, and an upper electrode layer 12 which is formed above the lower electrode layer 8 so that part of its lower surface will at least be in contact with the upper surface of the magnetoresistance effect layer 10.

The flat surface 14 on the left-hand end of the structure shown in FIG. 3 is the so-called ABS (Air Bearing Surface), which is formed by edges of the layers of the magnetoresistance element 2. As shown in FIG. 3, the lower electrode layer 8 is formed on part of the upper surface of the lower gap layer 6 on the ABS side. On the other part of the upper surface of the lower gap layer 6, a lower electrode anti-erosion/flaking layer 16 is formed around the lower electrode layer 8 so as to touch the edge 20 of the lower electrode layer 8. In this embodiment, the lower electrode anti-erosion/flaking layer 16 is formed so that its edge 18 will cover the edge 20 of the lower electrode layer 8.

The lower electrode anti-erosion/flaking layer 16 can be implemented by a single layer which is composed of metal, oxide or nitride, a mixture layer which is composed of a mixture of oxide and nitride, multiple layers each of which is selected from a metal layer, an oxide layer, a nitride layer and a mixture layer (composed of oxide and nitride), etc.

The upper electrode layer 12 is composed of a first upper electrode layer 22 and a second upper electrode layer 24. The first upper electrode layer 22 is formed directly on the magnetoresistance effect layer 10 in almost the same area as that of the magnetoresistance effect layer 10, and the second upper electrode layer 24 is formed above the lower electrode layer 8 (on an insulation layer 35 which is formed on the lower electrode layer 8 and the lower electrode anti-erosion/flaking layer 16) so that part of the lower surface of the second upper electrode layer 24 will be in contact with the upper surface 28 of the first upper electrode layer 22. An upper gap layer 30 is formed on the upper electrode layer 12, and an upper shield layer 31 is formed on the upper gap layer 30.

The magnetoresistance effect layer 10 is implemented by a ferromagnetic tunnel junction layers. Concretely, as shown in FIG.4, the magnetoresistance effect layer 10 includes a free layer 32 which is formed on the lower electrode layer 8, a non-magnetic layer 34 which is formed on the free layer 32, a pinned (fixed) layer 36 which is formed on the non-magnetic layer 34, and a pinning (fixing) layer 38 which is formed on the pinned layer 36 for pinning (fixing) the direction of magnetization of the pinned layer 36. As shown in FIG. 4, on both sides of the magnetoresistance effect layer 10, a longitudinal bias layer 40 is formed on the lower electrode layer 8 so that part of the longitudinal bias layer 40 will at least be in contact with the magnetoresistance effect layer 10 (free layer 32).

In the following, an example of a manufacturing method of a magnetoresistance element in accordance with the embodiment of the present invention will be described. FIG. 5A through FIG. 10 are plan views for explaining the steps of the manufacturing method in accordance with the embodiment, in which the same reference characters as those of FIGS. 3 and 4 designate the same parts as those of FIGS. 3 and 4.

Figure 5A:
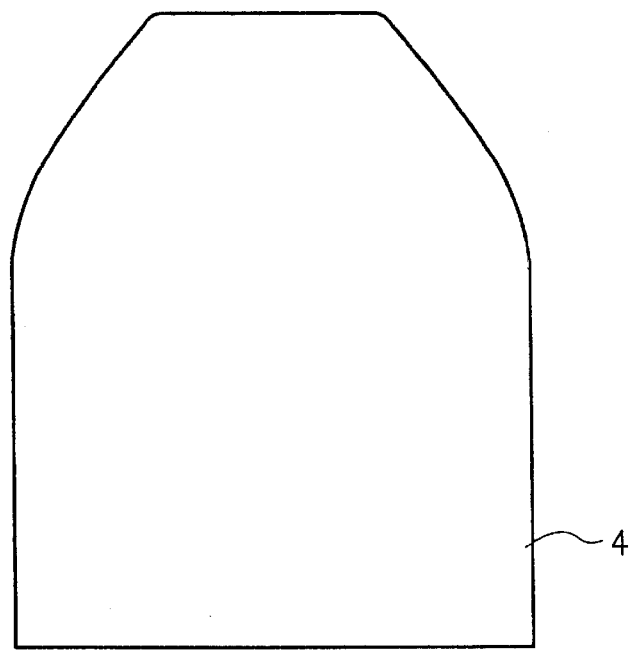
FIG. 5A through FIG. 10 are plan views for explaining the steps of a manufacturing method of a magnetoresistance element in accordance with an embodiment of the present invention.

(Step 1) First, the lower shield layer 4 (not patterned) is deposited uniformly on an unshown substrate, and a photoresist layer (pattern) is formed on the lower shield layer 4, and thereafter the lower shield layer 4 is patterned as shown in FIG. 5A by means of milling. In the case where lift-off is used for the patterning of the lower shield layer 4, the photoresist layer (pattern) is formed on the lower shield layer 4 first and the lower shield layer 4 (not patterned) is deposited thereon and thereafter the lift-off is conducted. Incidentally, thick lines in each figure (FIG. 5A~FIG. 10) indicate one or more parts which are formed in the step corresponding to the figure.

Figure 5B:
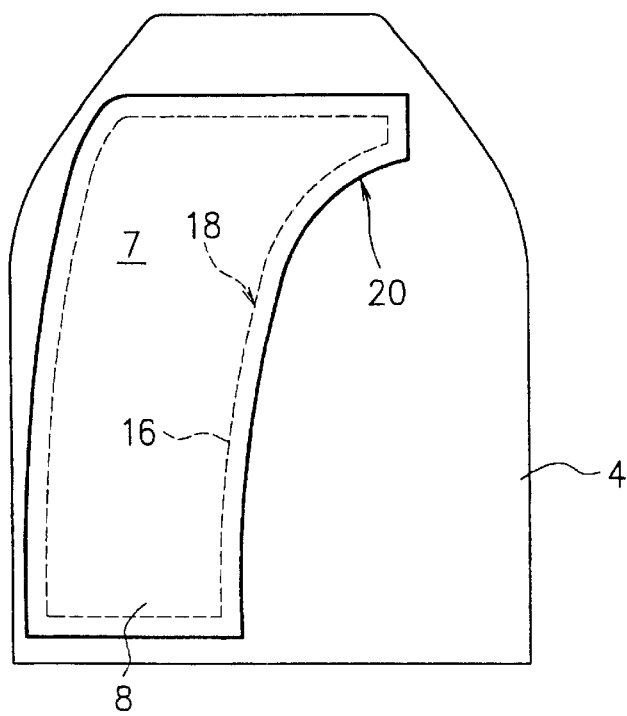

(Step 2) Subsequently, the lower electrode layer 8 is patterned to a predetermined shape as shown in FIG. 5B by depositing the lower electrode layer 8 (not patterned) on the lower shield layer 4, forming a photoresist layer 7 (pattern) thereon and conducting milling. (In this example, the lower gap layer 6 is omitted.) Subsequently, before removing the photoresist layer 7 remaining on the patterned lower electrode layer 8, the lower electrode anti-erosion/flaking layer 16 is formed around the lower electrode layer 8 so that the edge 18 of the lower electrode anti-erosion/flaking layer 16 will touch the edge 20 of the lower electrode layer 8. Thereafter, the photoresist layer 7 which is remaining on the patterned lower electrode layer 8 is removed by use of a release agent. Incidentally, in this example, the lower electrode anti-erosion/flaking layer 16 is formed so that its edge 18 will cover the edge of the lower electrode layer 8.

Figure 6A:
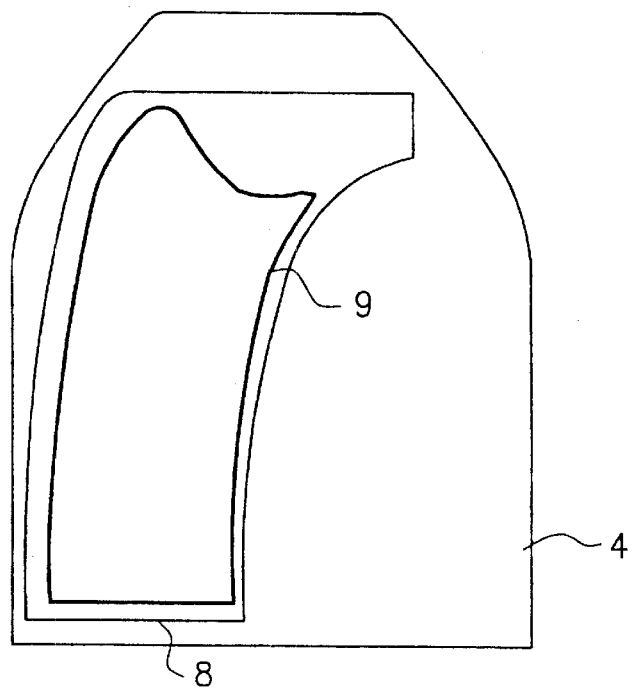

(Step 3) Subsequently, a lift-off photoresist layer (a photoresist pattern for lift-off) is formed on the lower electrode layer 8, the lower electrode thickening layer 9 (not patterned) is deposited, and the lower electrode thickening layer 9 is patterned by lift-off, thereby the lower electrode layer (8, 9) is completed (FIG. 6A).

Figure 6B:
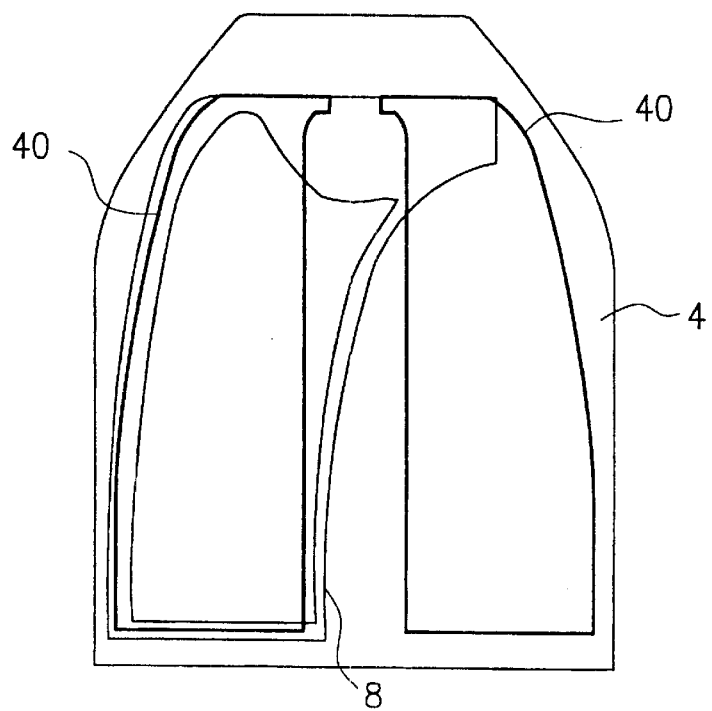

(Step 4) Subsequently, the longitudinal bias layer 40 (not patterned) is deposited, a photoresist layer (pattern) for patterning the longitudinal bias layer 40 is formed thereon, the longitudinal bias layer 40 is patterned as shown in FIG. 6B by milling, and the remaining photoresist layer is removed, thereby the patterned longitudinal bias layer 40 is obtained.

Figure 7A:
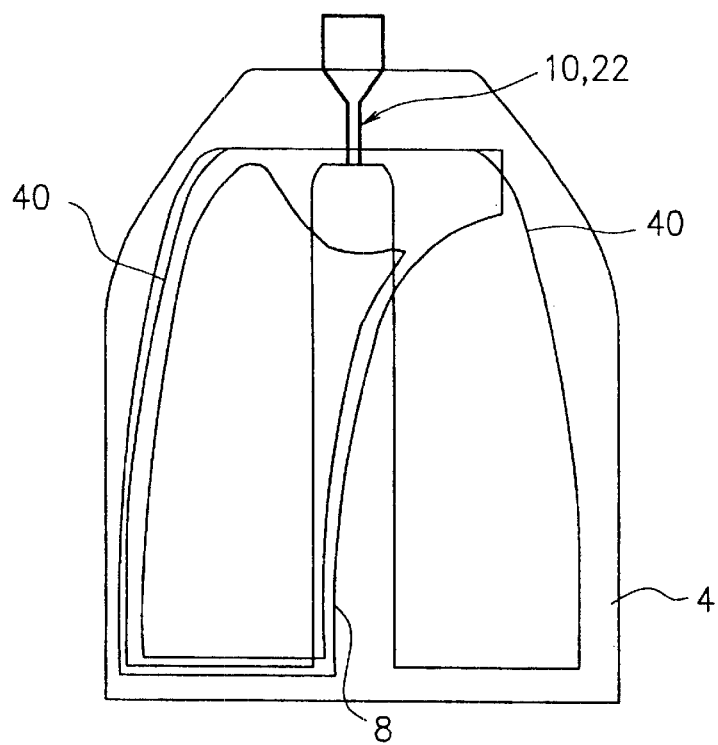

(Step 5) Subsequently, the magnetoresistance effect layer 10 and the first upper electrode layer 22 (not patterned) are deposited. On the layers, a photoresist layer for patterning (milling) is formed and milling is conducted to reach the non-magnetic layer 34. Thereafter, the insulation layer 35 (not patterned) is deposited, and the photoresist layer (and the insulation layer 35) remaining on the patterned first upper electrode layer 22 is removed (FIG. 7A).

Figure 7B:
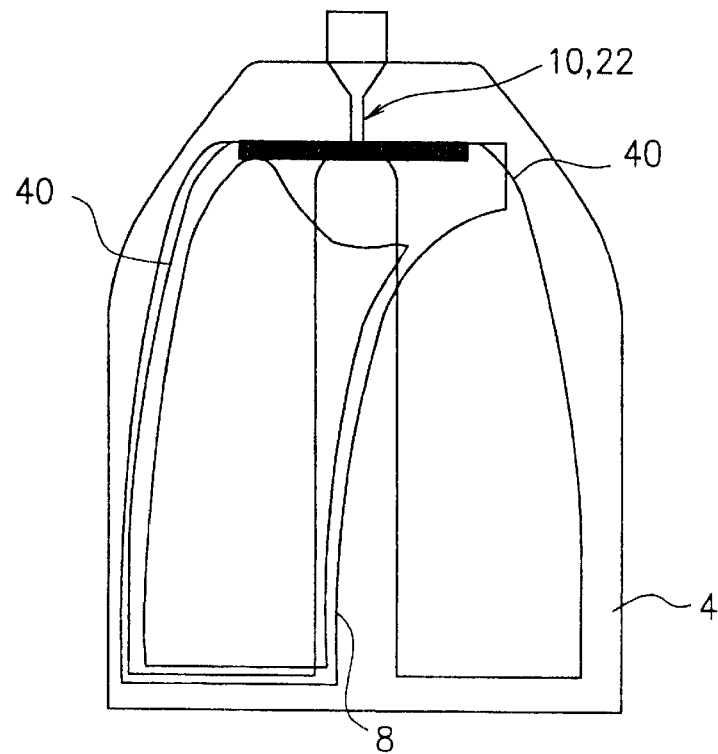

(Step 6) Subsequently, a photoresist layer is formed, milling of the insulation layer 35, the non-magnetic layer 34 and the free layer 32 (see FIG. 4) is conducted, and the remaining photoresist layer is removed (FIG. 7B).

Figure 8A:
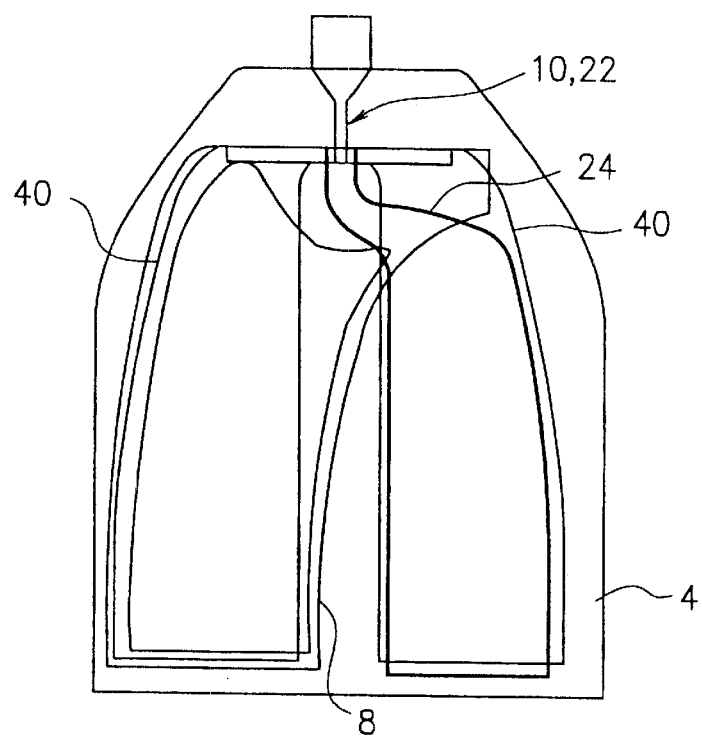

(Step 7) Subsequently, a photoresist layer for the lift-off of the second upper electrode layer 24 is formed, the second upper electrode layer 24 (not patterned) is deposited, and the lift-off is conducted for patterning the second upper electrode layer 24 (FIG.8A).

Figure 8B:
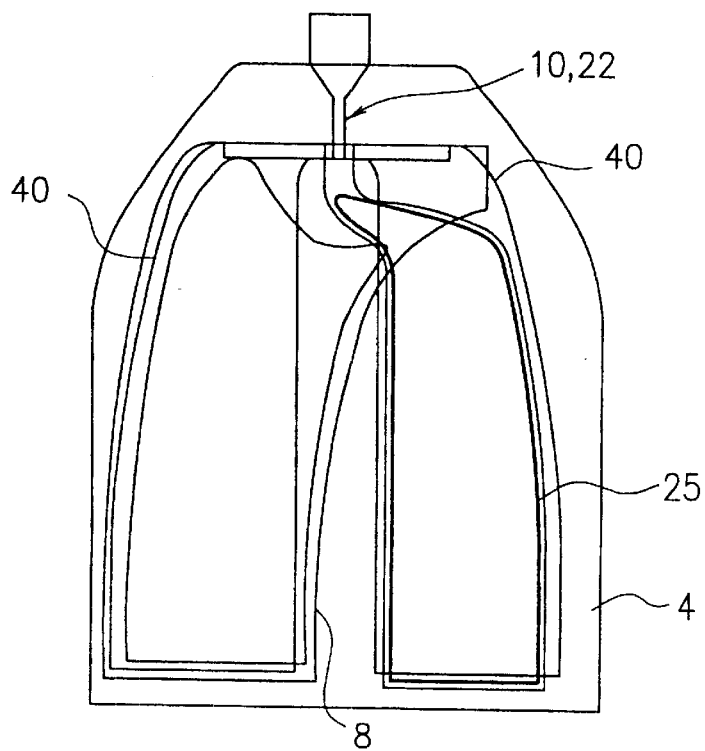

(Step 8) Subsequently, a photoresist layer for the lift-off of a second upper electrode thickening layer 25 is formed, the second upper electrode thickening layer 25 (not patterned) is deposited, and the lift-off is conducted for patterning the second upper electrode thickening layer 25 (FIG. 8B).

Figure 9A:
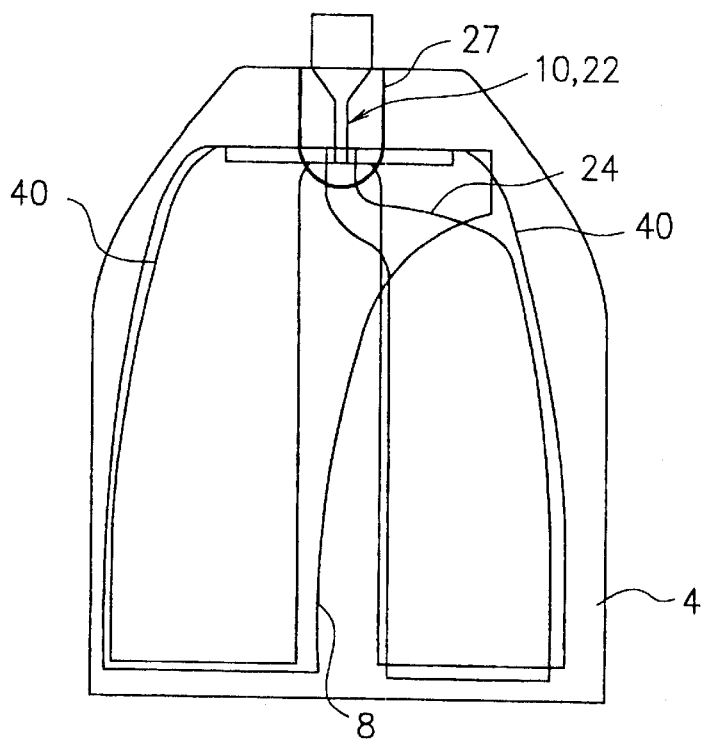

(Step 9) Subsequently, a photoresist layer for the lift-off of an insulation thickening layer 27 is formed, the insulation thickening layer (not patterned) is deposited, and the lift-off is conducted for patterning the insulation thickening layer 27 (FIG. 9A).

Figure 9B:
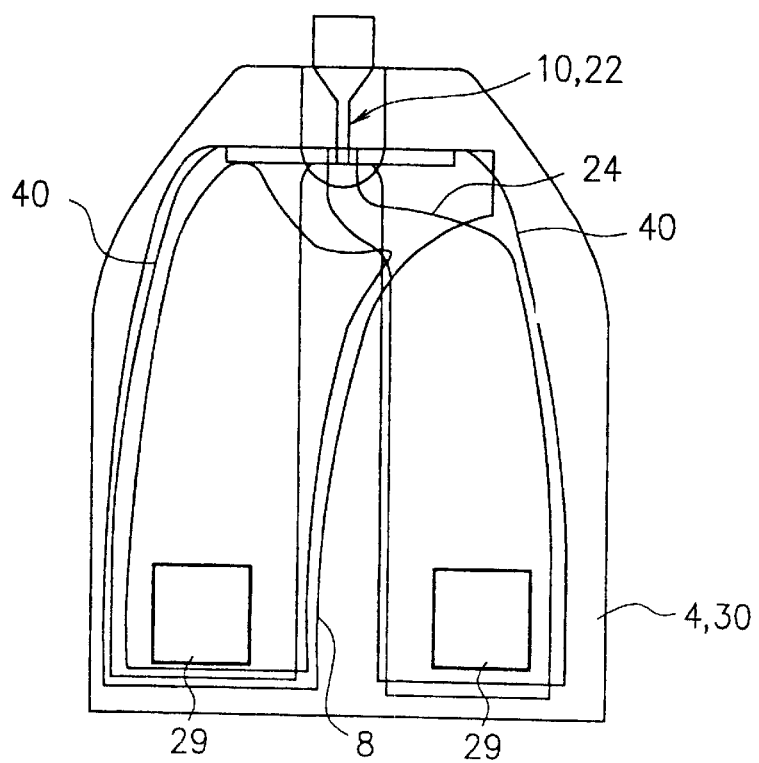

(Step 10) Subsequently, the upper gap layer 30 is deposited, a photoresist layer (pattern) for the formation of electrode holes (electrode exposed sections 29) is formed, milling is executed until the second upper electrode layer 24 is exposed, and the remaining photoresist layer is removed, thereby electrode exposed sections 29 are formed (FIG. 9B).

Figure 10:
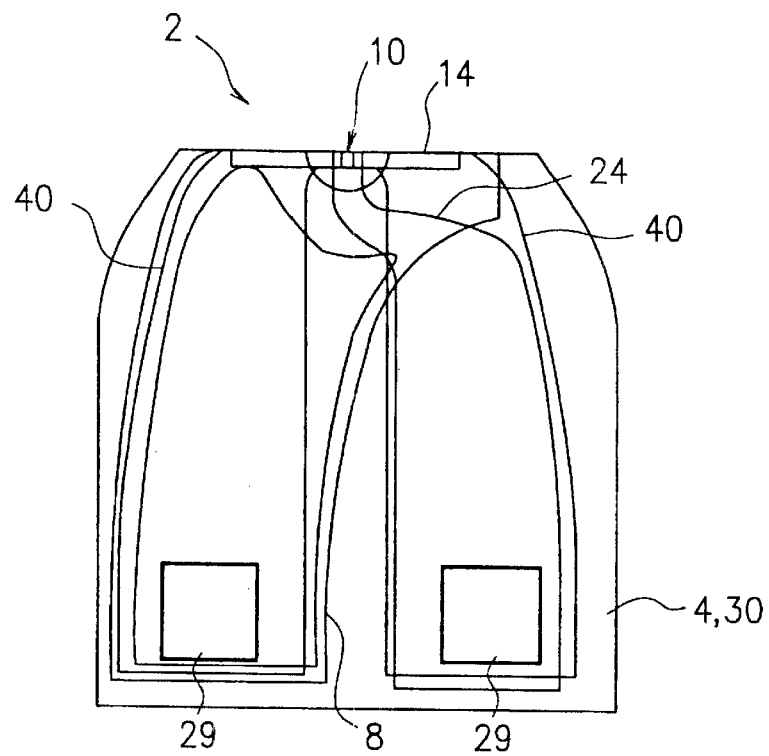

(Step 11) Subsequently, the substrate is cut and separated to pieces of appropriate sizes, and each substrate piece is ground until the ABS (Air Bearing Surface) 14 is exposed (FIG. 10).

Incidentally, when the magnetoresistance element 2 is used for a magnetic recording reproduction head, a recording head section having appropriate composition is formed before the above step 11. The ABS 14 is ground to have an appropriate shape so that the magnetic recording reproduction head will maintain the optimum flight attitude in its operating status. The magnetic recording reproduction head is attached to suspension and necessary wires are connected to the lower electrode layer 8 and the upper electrode layer 12.

As explained above, in the manufacturing method of a magnetoresistance element in accordance with the embodiment of the present invention, the photoresist layer 7 (shown in FIG. 5B) which remained after the patterning of the lower electrode layer 8 is not removed at once, but is removed after the formation of the lower electrode anti-erosion/flaking layer 16. Therefore, the edge 20 of the lower electrode layer 8, which is covered by the edge 18 of the lower electrode anti-erosion/flaking layer 16, is not exposed to the release agent containing the dissolved photoresist, thereby the problem of the prior art (erosion/flaking of the edge 20 of the lower electrode layer 8 and increase of roughness of the edge 20) is avoided. Therefore, by the magnetoresistance element manufacturing method, the electrical short between the lower electrode layer 8 and the second upper electrode layer 24 can be prevented, thereby magnetoresistance elements 2 of high sensitivity and high performance can be manufactured and manufacturing yield of the magnetoresistance elements 2 can be improved.

In the composition of the magnetoresistance element 2, when a sense current is passed from the upper electrode layer 12 (second upper electrode layer 24) to the lower electrode layer 8, the sense current successively passes through the second upper electrode layer 24, the first upper electrode layer 22, the pinning layer 38, the pinned layer 36, the non-magnetic layer 34, the free layer 32 and the lower electrode layer 8. The longitudinal bias layer 40 does not affect the status of the sense current since the longitudinal bias layer 40 is electrically insulated from the pinned layer 36 and upper layers by the free layer 32, the non-magnetic layer 34 and the insulation layer 35.

In the composition, the longitudinal bias layer 40 is in contact with the free layer 32, therefore, the longitudinal bias magnetic field of the longitudinal bias layer 40 is sufficiently applied to the free layer 32. Therefore, both the passing of the sense current through the magnetoresistance effect layer 10 correctly and the correct application of the longitudinal bias magnetic field to the free layer 32 can be attained at the same time.

The manufacturing method of a magnetoresistance element which has been described above can also be applied to various types of magnetoresistance elements other than the magnetoresistance element 2 of FIGS. 3 and 4 and the same effects can be attained.

For example, while the edge 18 of the lower electrode anti-erosion/flaking layer 16 was formed so as to cover the edge 20 of the lower electrode layer 8 in FIGS. 3 and 4, the edge 18 of the lower electrode anti-erosion/flaking layer 16 can also be formed only to be in contact with the edge 20 of the lower electrode layer 8. Also in such composition, the edge 20 of the lower electrode layer 8 is protected by the lower electrode anti-erosion/flaking layer 16 from being exposed to the release agent containing the dissolved photoresist in the step for removing the photoresist layer remaining on the lower electrode layer 8, and thereby the increase of the roughness of the edge 20 can be avoided.

While the lower electrode layer 8 is formed on the lower gap layer 6 which is formed on the lower shield layer 4 in the example shown in FIGS. 3 and 4, it is also possible to omit the lower gap layer 6 and form the lower electrode layer 8 directly on the lower shield layer 4, as the case of the above manufacturing method. The upper gap layer 30 can also be omitted in the same way.

It is also possible to provide an underlayer under the free layer 32, or an upper layer between the pinning layer 38 and the upper electrode layer 12. While the upper electrode layer 12 in the above example was composed of the first upper electrode layer 22 and the second upper electrode layer 24, it is also possible to omit the first upper electrode layer 22. In addition, the composition of the magnetoresistance effect layer 10 is not limited to the composition shown in FIG. 4, but various layered magnetic structure can be employed for the magnetoresistance effect layer 10.

Figure 11:
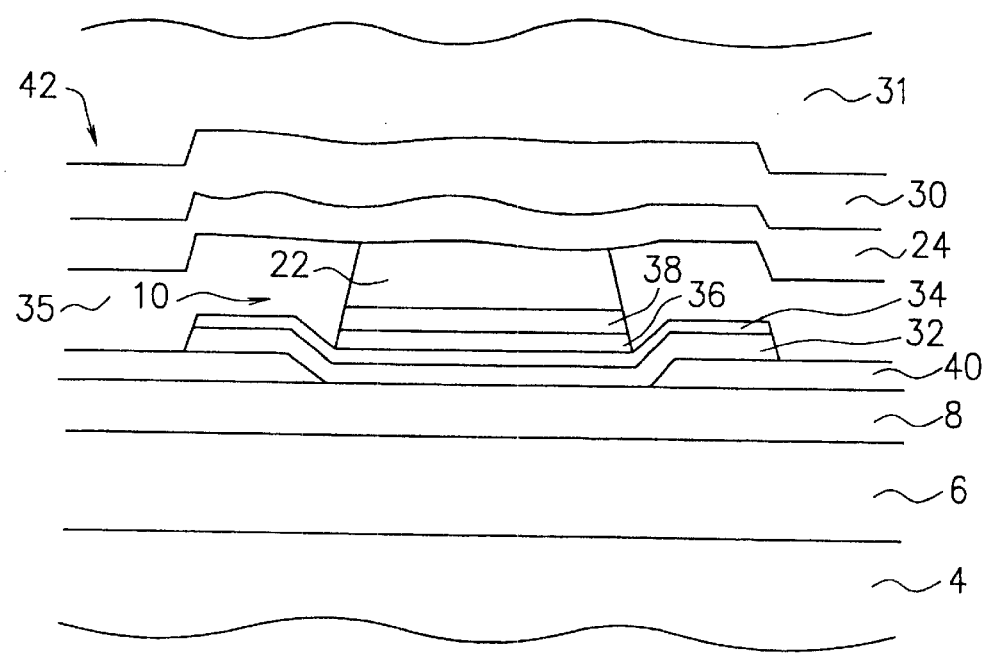

FIG. 11 is an enlarged vertical sectional view showing another example of a magnetoresistance element in accordance with the present invention (a magnetoresistance element to which the present invention can be applied), in which a magnetoresistance effect layer 10 of different composition is employed. FIG. 11 shows a vertical section corresponding to FIG. 4, in which the same reference characters as those of FIG. 4 designate the same parts as those of FIG. 4. In the magnetoresistance element 42 shown in FIG. 11, the free layer 32 and the non-magnetic layer 34 are formed in an area of a limited width near the pinned layer 36 etc.

FIG. 12 is an enlarged vertical sectional view showing still another example of a magnetoresistance element in accordance with the present invention (a magnetoresistance element to which the present invention can be applied), in which a magnetoresistance effect layer 10 of different composition is employed. FIG. 12 shows a vertical section corresponding to FIG. 4, in which the same reference characters as those of FIG. 4 designate the same parts as those of FIG. 4. In the magnetoresistance element 44 shown in FIG. 12, the area for the free layer 32 and the non-magnetic layer 34 is made still narrower than the case of FIG. 11, in which the width of the area is confined within the edges of the longitudinal bias layer 40 facing the pinned layer 36.

Incidentally, with respect to the vertical section of FIG. 3, the magnetoresistance elements 42 and 44 of FIGS. 11 and 12 have the same structure as that of the magnetoresistance element 2 of FIG. 4.

The present invention can also be applied to such magnetoresistance elements 42 and 44, and by forming the lower electrode anti-erosion/flaking layer 16 around the lower electrode layer 8 so as to be in contact with the edge 20 of the lower electrode layer 8, the erosion of the edge 20 of the lower electrode layer 8 in the photoresist removal step in the patterning of the lower electrode layer 8 can be avoided.

Figure 13:
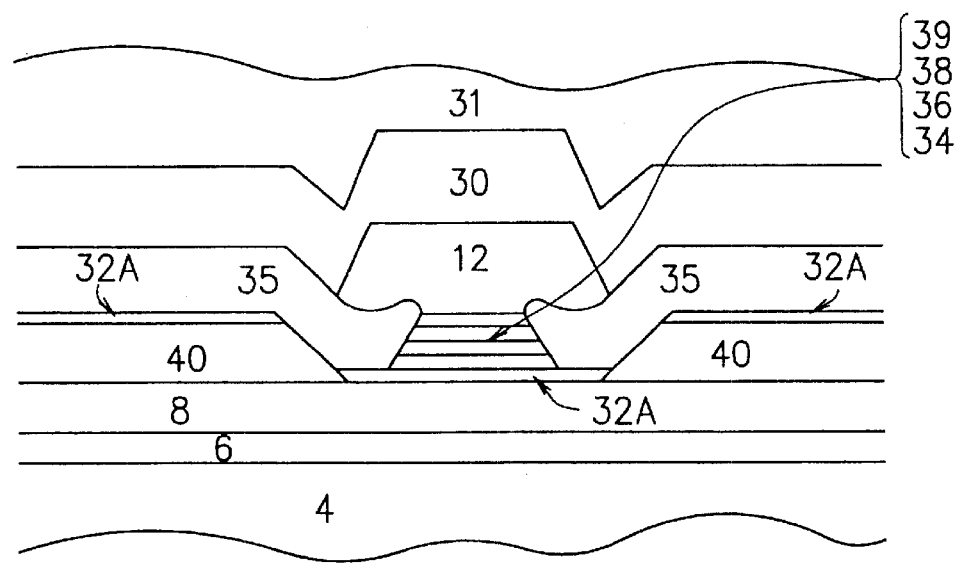

FIG. 13 is an enlarged vertical sectional view showing still another example of a magnetoresistance element in accordance with the present invention (a magnetoresistance element to which the present invention can be applied), in which a magnetoresistance effect layer 10 of different composition is employed. FIG. 13 shows a vertical section corresponding to FIG. 4, in which the same reference characters as those of FIG. 4 designate the same parts as those of FIG. 4. In the composition of FIG. 13, an under/free layer 32A (free layer 32 with an underlayer) is used instead of the free layer 32 shown in FIG. 4. The under/free layer 32A is not formed on the inner edges of the longitudinal bias layer 40. On part of the under/free layer 32A between the inner edges of the longitudinal bias layer 40, the non-magnetic layer 34, the pinned layer 36, the pinning layer 38 and an upper layer 39 are successively deposited and patterned as shown in FIG. 13. Around the patterned layers 34, 36, 38 and 39, the insulation layer 35 is formed. On the layered structure, the upper electrode layer 12 (which is smaller than the upper electrode layer 12 of FIG. 4), the upper gap layer 30 and the upper shield layer 31 are formed. In the example, the magnetoresistance effect layer 10 is composed of the under/free layer 32A, the non-magnetic layer 34, the pinned layer 36, the pinning layer 38 and the upper layer 39.

In the composition of FIG. 13, when a sense current is passed from the upper electrode layer 12 to the lower electrode layer 8, the sense current successively passes through the upper electrode layer 12, the upper layer 39, the pinning layer 38, the pinned layer 36, the non-magnetic layer 34, the under/free layer 32A and the lower electrode layer 8, and the longitudinal bias layer 40 does not affect the status of the sense current. The longitudinal bias layer 40 is in contact with the under/free layer 32A, therefore, the longitudinal bias magnetic field of the longitudinal bias layer 40 is sufficiently applied to the under/free layer 32A. Therefore, both the passing of the sense current through the magnetoresistance effect layer 10 correctly and the correct application of the longitudinal bias magnetic field to the under/free layer 32A can be attained at the same time.

While the magnetoresistance element of FIG. 13 is provided with both the upper gap layer 30 and the lower gap layer 6, it is also possible to omit one or both of them. While the underlayer was provided between the lower electrode layer 8 and the free layer, the use of the underlayer is optional. While the patterning of the magnetoresistance effect layer 10 is conducted to the bottom of the non-magnetic layer 34 in FIG. 13, the patterning can be ended at an arbitrary point between the upper surface of the non-magnetic layer 34 and the lower surface of the under/free layer 32A. Incidentally, part of the under/free layer 32A formed on the longitudinal bias layer 40 is unnecessary.

Figure 14:
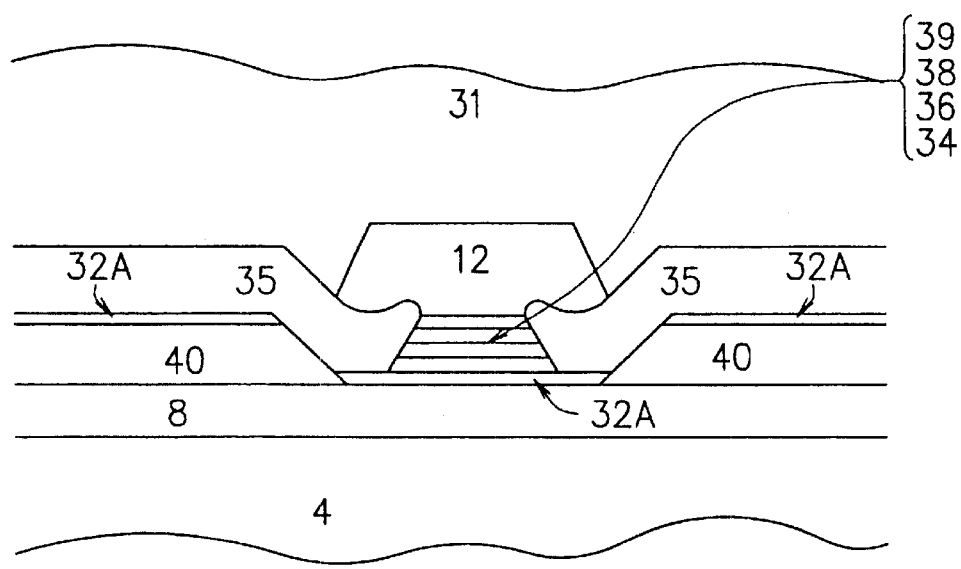

FIG. 14 is an enlarged vertical sectional view showing still another example of a magnetoresistance element in accordance with the present invention (a magnetoresistance element to which the present invention can be applied), in which both the upper gap layer 30 and the lower gap layer 6 of the magnetoresistance element of FIG. 13 are omitted.

Figure 15:
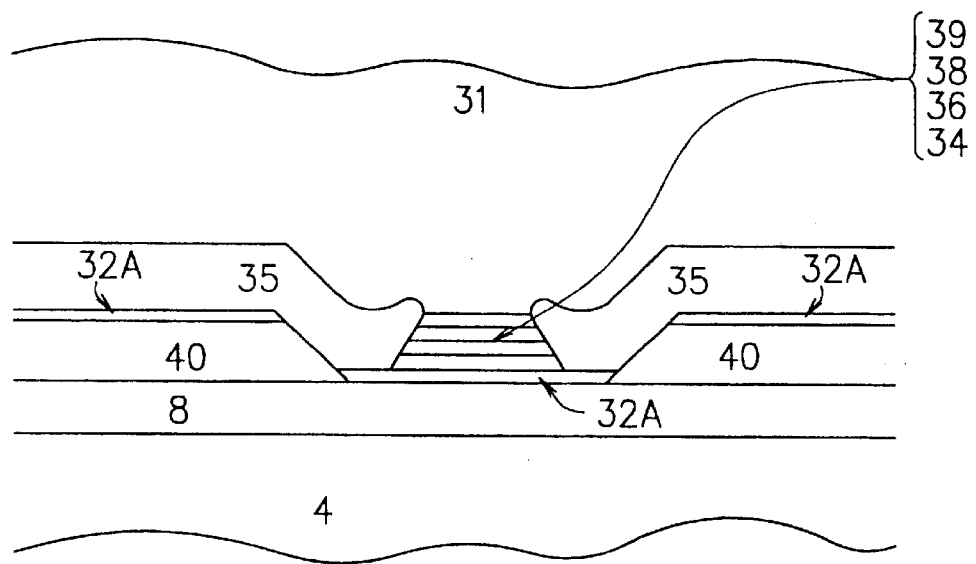

FIG. 15 is an enlarged vertical sectional view showing still another example of a magnetoresistance element in accordance with the present invention (a magnetoresistance element to which the present invention can be applied), in which the upper electrode layer 12 of the magnetoresistance element of FIG. 14 is omitted. In this case, the upper shield layer 31 also serves as the upper electrode layer.

Figure 16:
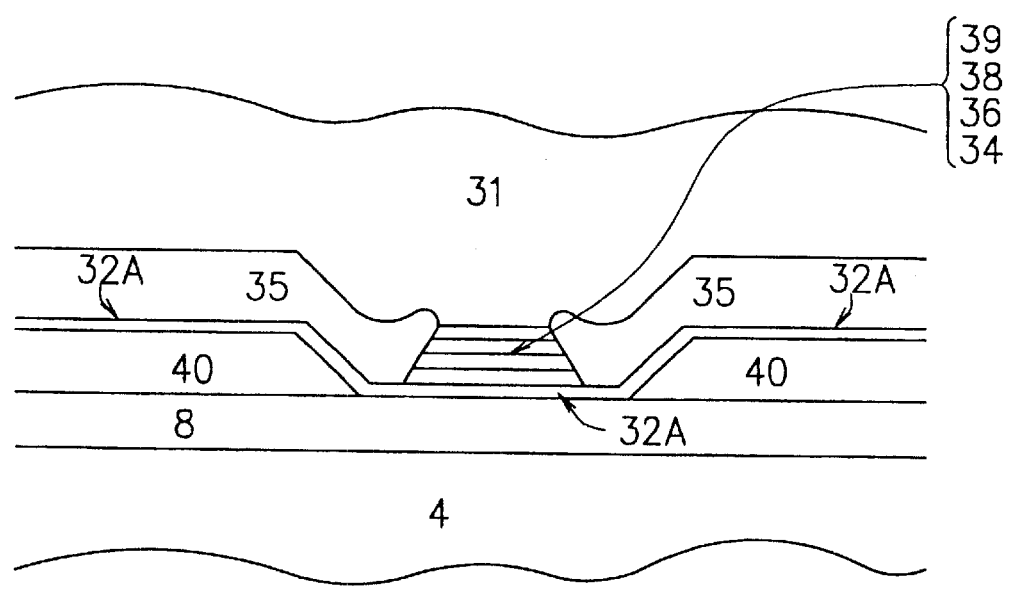

FIG. 16 is an enlarged vertical sectional view showing still another example of a magnetoresistance element in accordance with the present invention (a magnetoresistance element to which the present invention can be applied), in which the under/free layer 32A of FIG. 15 is also formed on the inner edges (slopes) of the longitudinal bias layer 40.

Figure 17:
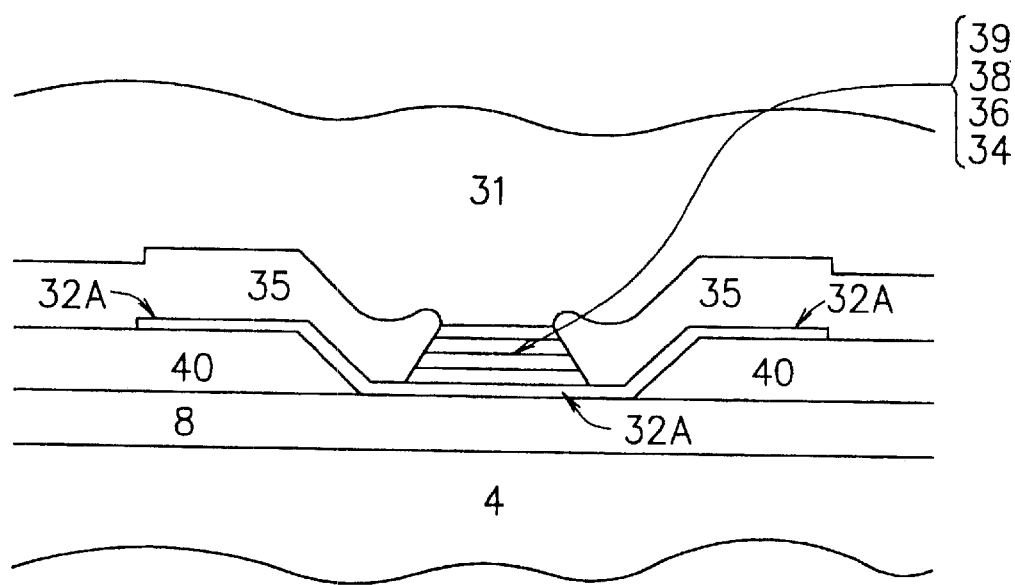

FIG. 17 is an enlarged vertical sectional view showing still another example of a magnetoresistance element in accordance with the present invention (a magnetoresistance element to which the present invention can be applied), in which the width of the under/free layer 32A of FIG. 15 is made narrower.

Figure 18:
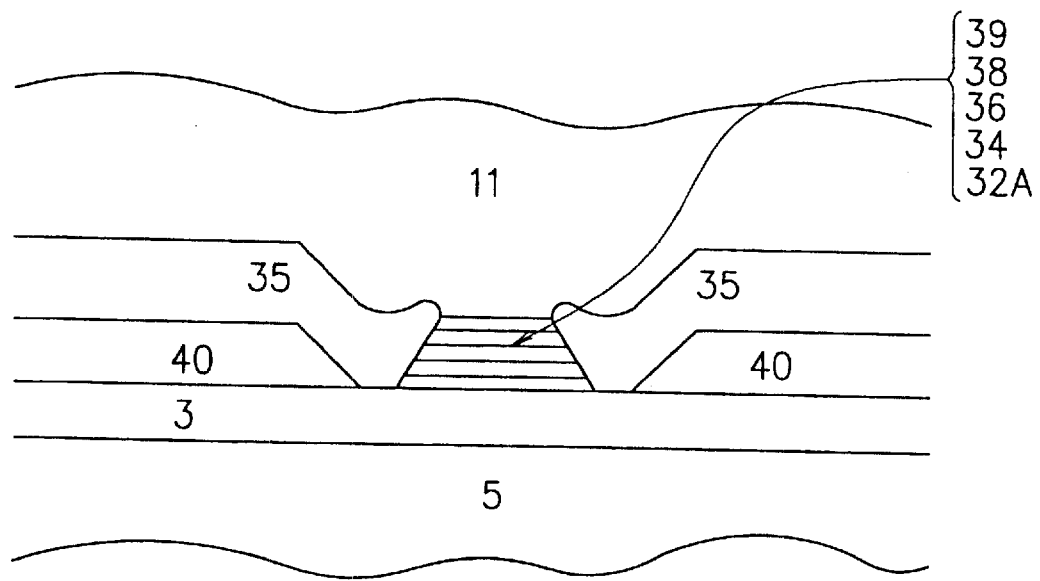

FIG. 18 is an enlarged vertical sectional view showing still another example of a magnetoresistance element in accordance with the present invention (a magnetoresistance element to which the present invention can be applied), in which the patterning of the magnetoresistance effect layer 10 is conducted perfectly to the lower surface of the under/free layer 32A. It is also possible to stop the patterning at the upper surface of the underlayer. In the example, the longitudinal bias layer 40 is not in contact with the under/free layer 32A, however, the longitudinal bias magnetic field of the longitudinal bias layer 40 can be applied to the under/ free layer 32A sufficiently if the edges of the under/free layer 32A are placed near the inner edges of the longitudinal bias layer 40. A lower shield/electrode layer 5 (a lower electrode layer which also serves as a lower shield layer) and a lower conduction layer are used instead of the lower shield layer 4 and the lower electrode layer 8 of FIG. 17. Incidentally, the reference character "11" in FIG. 18 and following figures denotes an upper shield/electrode layer (the upper shield layer 31 that also serves as the upper electrode).

Figure 19:
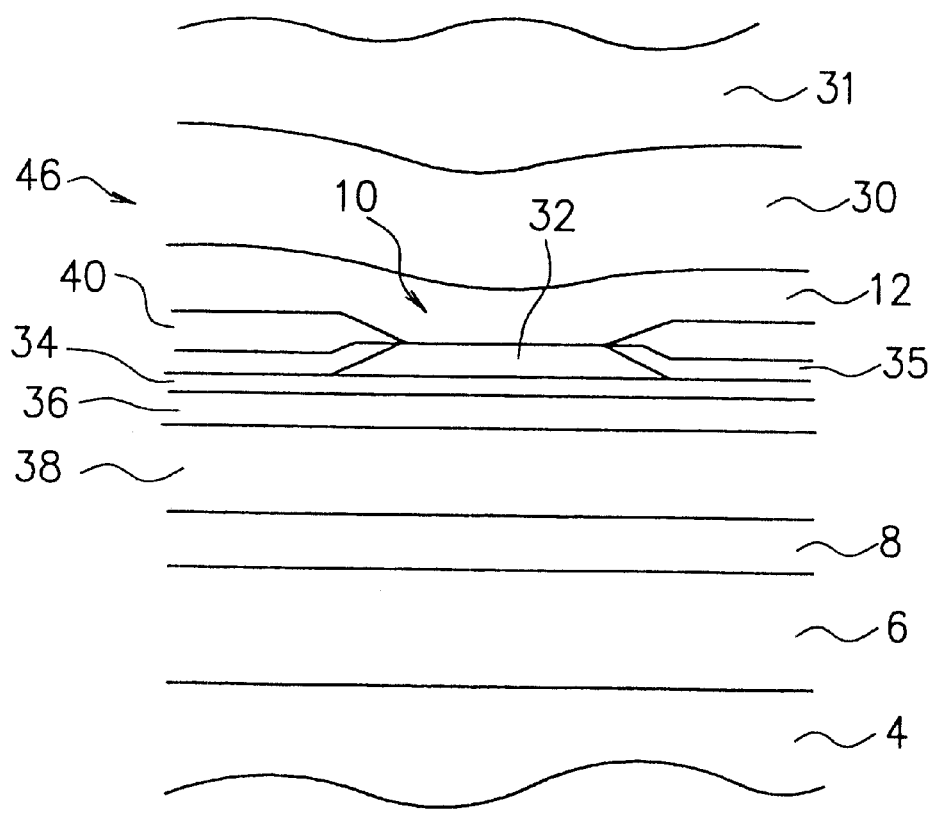

FIG. 19 is an enlarged vertical sectional view showing still another example of a magnetoresistance element in accordance with the present invention (a magnetoresistance element to which the present invention can be applied), in which a magnetoresistance effect layer 10 of different composition is employed. FIG. 19 shows a vertical section corresponding to FIG. 4, in which the same reference characters as those of FIG. 4 designate the same parts as those of FIG. 4. In the magnetoresistance element 46 shown in FIG. 19, on the lower electrode layer 8, the pinning layer 38, the pinned layer 36, the non-magnetic layer 34 and the free layer 32 are formed successively, in a reverse order compared to FIG. 4. Such structure of the magnetoresistance element 46 is as typical as the structure of the magnetoresistance element 2 of FIG. 4. Also in such a magnetoresistance element 46, by forming the lower electrode anti-erosion/flaking layer 16 around the lower electrode layer 8 so as to be in contact with the edge 20 of the lower electrode layer 8, the erosion/flaking of the edge 20 of the lower electrode layer 8 in the photoresist removal step can be avoided.

In such composition of the magnetoresistance element 46 of FIG. 19, when the sense current is passed from the upper electrode layer 12 to the lower electrode layer 8, the sense current successively passes through the upper electrode layer 12, the free layer 32, the non-magnetic layer 34, the pinned layer 36, the pinning layer 38 and the lower electrode layer 8. The longitudinal bias layer 40 does not affect the status of the sense current since the longitudinal bias layer 40 is electrically insulated from the pinned layer 36 and lower layers by the insulation layer 35 and the non-magnetic layer 34.

In the composition, the longitudinal bias layer 40 is in contact with the free layer 32, therefore, the longitudinal bias magnetic field of the longitudinal bias layer 40 is sufficiently applied to the free layer 32. Therefore, both the passing of the sense current through the magnetoresistance effect layer 10 correctly and the application of the longitudinal bias magnetic field to the free layer 32 correctly can be attained at the same time.

While the magnetoresistance element 46 of FIG. 19 included the lower gap layer 6 (between the lower shield layer 4 and the lower electrode layer 8) and the upper gap layer 30 (between the upper electrode layer 12 and the upper shield layer 31), the effects of the present invention can also be attained even if the lower gap layer 6 and/or the upper gap layer 30 are omitted.

It is also possible to provide an upper layer between the free layer 32 and the upper electrode layer 12 and/or between the longitudinal bias layer 40 and the upper electrode layer 12, or an underlayer between the pinning layer 38 and the lower electrode layer 8. While only the free layer 32 is patterned in the four layers of the magnetoresistance effect layer 10 in the magnetoresistance element 46 of FIG. 19, the patterning of the magnetoresistance effect layer 10 can be conducted to an arbitrary point as long as the free layer 32 is patterned. When the longitudinal bias layer 40 is composed of oxide, the insulation layer 35 below the longitudinal bias layer 40 can be omitted since the longitudinal bias layer 40 itself serves as the insulation layer.

FIG. 20 is an enlarged vertical sectional view showing still another example of a magnetoresistance element in accordance with the present invention (a magnetoresistance element to which the present invention can be applied). In FIG. 20, a lower conduction layer 3 is formed on a lower shield/electrode layer 5, and a magnetoresistance effect layer 10 is formed on the lower conduction layer 3. In the magnetoresistance effect layer 10 of FIG. 20, an under/pinning layer 13 (pinning layer 38 with an underlayer), the pinned layer 36, the non-magnetic layer 34, the free layer 32 and the upper layer 39 are successively deposited and patterned. While the patterning of the magnetoresistance effect layer 10 is conducted to the bottom of the under/pinning layer 13 in FIG. 20, the endpoint of the patterning can be altered arbitrarily. The insulation layer 35 is formed around the magnetoresistance effect layer 10, and the longitudinal bias layer 40 is formed on the insulation layer 35. On the structure, the upper shield/electrode layer 11 (the upper shield layer 31 that also serves as the upper electrode) is formed. While the longitudinal bias layer 40 is in contact with the magnetoresistance effect layer 10 in FIG. 20, the contact is unnecessary if they are near to each other.

In the composition of FIG. 20, the longitudinal bias layer 40 does not affect the status of the sense current. The longitudinal bias layer 40 is in contact with (or near) the free layer 32, therefore, the longitudinal bias magnetic field of the longitudinal bias layer 40 is sufficiently applied to the free layer 32. Therefore, both the passing of the sense current through the magnetoresistance effect layer 10 correctly and the correct application of the longitudinal bias magnetic field to the free layer 32 can be attained at the same time.

While the lower shield/electrode layer 5 and the lower conduction layer 3 were employed in FIG. 20, the lower conduction layer 3 can be omitted. The lower shield/electrode layer 5 can also be separated to the lower shield layer 4 and the lower electrode layer 8, and the lower gap layer 6 can also be provided between the two layers. It is also possible to form the special-purpose upper electrode layer 12 between the upper layer 39 of the magnetoresistance effect layer 10 and the upper shield(/electrode) layer 11. The upper gap layer 30 can also be formed between the upper electrode layer and the upper shield layer. The underlayer of the magnetoresistance effect layer 10 can be omitted.

FIG. 21 is an enlarged vertical sectional view showing still another example of a magnetoresistance element in accordance with the present invention (a magnetoresistance element to which the present invention can be applied), in which the longitudinal bias layer 40 is formed in the insulation layer 35. The longitudinal bias layer 40 of FIG. 21 is not in contact with the magnetoresistance effect layer 10.

In the composition of FIG. 21, the longitudinal bias layer 40 does not affect the status of the sense current. The longitudinal bias layer 40 is formed nearby the free layer 32, therefore, the longitudinal bias magnetic field of the longitudinal bias layer 40 is sufficiently applied to the free layer 32. Therefore, both the passing of the sense current through the magnetoresistance effect layer 10 correctly and the correct application of the longitudinal bias magnetic field to the free layer 32 can be attained at the same time.

While the lower shield/electrode layer 5 and the lower conduction layer 3 were employed in FIG. 21, the lower conduction layer 3 can be omitted. The lower shield/electrode layer 5 can also be separated to the lower shield layer 4 and the lower electrode layer 8, and the lower gap layer 6 can also be provided between the two layers. It is also possible to form the special-purpose upper electrode layer 12 between the upper layer 39 of the magnetoresistance effect layer 10 and the upper shield(/electrode) layer 11. The upper gap layer 30 can also be formed between the upper electrode layer and the upper shield layer. The underlayer of the magnetoresistance effect layer 10 can be omitted.

The above examples of the magnetoresistance elements (42, 44, 46, etc.) can be manufactured by manufacturing methods which are similar to the manufacturing method which has been explained referring to FIG. 5A through FIG.10.

Each layer of the magnetoresistance element (2, 42, 44, 46, etc.) can be formed by use of the following materials:

(1) [substrate]: altic ($Al_2O_3 \cdot TiC$), SiC, alumina, altic/alumina (2 layers), SiC/alumina (2 layers), etc.

(2) [lower shield layer 4]: a single layer or multiple layers each layer of which is composed of one or more materials selected from NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, Fe nitride-based material, MnZn ferrite, NiZn ferrite and MgZn ferrite (3) [lower electrode layer 8]: a single layer or multiple layers each layer of which is composed of one or more materials selected from Au, Ag, Cu, Mo, W, Y, Ti, Zr, Hf, V, Nb, Pt and Ta (4) [lower electrode anti-erosion/flaking layer 16]:
  (a) a single layer or multiple layers each layer of which is composed of one or more materials selected from Ti, Cr, Co, Y, Zr, Nb, Mo, Ru, Rh, Pd, Ag, Hf, Ta, W, Ir, Pt, Au, Si and Ni
  (b) a single layer or multiple layers each layer of which is composed of one or more materials selected from oxides and nitrides of Ti, V, Cr, Co, Cu, Zn, Y, Zr, Nb, Mo, Tc, Ru, Rh, Pd, Ag, Hf, Ta, W, Re, Os, Ir, Pt, Au, Si, Al and Ni
  (c) multiple layers composed of (a) and (b)

(5) [upper electrode layer 12]: a single layer or multiple layers each layer of which is composed of one or more materials selected from Au, Ag, Cu, Mo, W, Y, Ti, Zr, Hf, V, Nb, Pt and Ta (6) [upper shield layer 31]: a single layer or multiple layers each layer of which is composed of one or more materials selected from NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, Fe nitride-based material, MnZn ferrite, NiZn ferrite and MgZn ferrite (7) [insulation layer 35]: a single layer or multiple layers each layer of which is composed of one or more materials selected from Al oxide, Si oxide, Al nitride, Si nitride and diamond-like carbon (8) [lower gap layer 6]: a single layer or multiple layers each layer of which is composed of one or more materials selected from Al oxide, Si oxide, Al nitride, Si nitride and diamond-like carbon (9) [upper gap layer 30]: a single layer or multiple layers each layer of which is composed of one or more materials selected from Al oxide, Si oxide, Al nitride, Si nitride and diamond-like carbon

(10) [upper layer]: a single layer or multiple layers each layer of which is composed of one or more materials selected from Au, Ag, Cu, Mo, W, Y, Ti, Zr, Hf, V, Nb, Pt and Ta

(11) [longitudinal bias layer 40]: a single layer or multiple layers each layer of which is composed of one or more materials selected from CoCrPt, CoCr, CoPt, CoCrTa, FeMn, NiMn, Ni oxide, NiCo oxide, Fe oxide, NiFe oxide, IrMn, PtMn, PtPdMn, ReMn, Co ferrite and Ba ferrite The magnetoresistance effect layer 10 can be implemented by the following detailed compositions, for example:

(a) substrate/underlayer/free layer/first MR enhancement layer/non-magnetic layer/second MR enhancement layer/pinned layer/pinning layer/protection layer (b) substrate/underlayer/pinning layer/pinned layer/first MR enhancement layer/non-magnetic layer/second MR enhancement layer/free layer/protection layer (c) substrate/underlayer/first pinning layer/first pinned layer/first MR enhancement layer/non-magnetic layer/second MR enhancement layer/free layer/third MR enhancement layer/non-magnetic layer/fourth MR enhancement layer/second pinned layer/second pinning layer/protection layer (d) substrate/underlayer/pinned layer (self-pinning)/first MR enhancement layer/non-magnetic layer/second MR enhancement layer/free layer/protection layer (e) substrate/underlayer/free layer/first MR enhancement layer/non-magnetic layer/second MR enhancement layer/pinned layer (self-pinning)/protection layer As materials for the underlayer of the magnetoresistance effect layer 10, a single layer or multiple layers each layer of which is composed of one or more metals can be employed. Concretely, the one or more metals for each layer can be selected from Ta, Hf, Zr, W, Cr, Ti, Mo, Pt, Ni, Ir, Cu, Ag, Co, Zn, Ru, Rh, Re, Au, Os, Pd, Nb and V. It is also possible to use one or more metals selected from Ta, Hf, Zr, W, Cr, Ti, Mo, Pt, Ni, Ir, Cu, Ag, Co, Zn, Ru, Rh, Re, Au, Os, Pd, Nb and V as additive elements. Incidentally, in the magnetoresistance element in accordance with the embodiment of the present invention, the use of the underlayer is optional.

As materials for the free layer 32 of the magnetoresistance effect layer 10, NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi and amorphous magnetic materials can be employed.

The non-magnetic layer 34 of the magnetoresistance effect layer 10 can be implemented by a single layer composed of oxide, nitride or a mixture of oxide and nitride, or two layers such as metal/oxide, metal/nitride, metal/(mixture of oxide and nitride), etc. Concretely, the non-magnetic layer 34 can preferably be formed by the following compositions:

(a) a single layer or multiple layers each layer of which is composed of one or more materials selected from Ti, V, Cr, Cu, Zn, Y, Zr, Nb, Mo, Tc, Ru, Rh, Pd, Ag, Hf, Ta, W, Re, Os, Ir, Pt, Au, Si and Al (b) a single layer or multiple layers each layer of which is composed of one or more materials selected from oxides and nitrides of Ti, V, Cr, Co, Cu. Zn, Y, Zr, Nb, Mo, Tc, Ru, Rh, Pd, Ag, Hf, Ta, W, Re, Os, Ir, Pt, Au, Si, Al and Ni (c) multiple layers composed of (a) and (b)

As materials for the first through fourth MR enhancement layers of the magnetoresistance effect layer 10, Co, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi and amorphous magnetic materials can be employed. If the MR enhancement layers are not used, the MR ratio becomes a little lower, however, the number of necessary manufacturing steps can be reduced by omitting the MR enhancement layers.

As materials for the pinned layer 36 of the magnetoresistance effect layer 10, Co, Ni, NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi and amorphous magnetic materials can be employed. It is also possible to employ multiple layers which are composed of one or more layers each of which is formed of one or more of the above materials and one or more layers each of which is formed of one or more materials selected from Ti, V, Cr, Cu, Zn, Y, Zr, Nb, Mo, Tc, Ru, Rh, Pd, Ag, Hf, Ta, W, Re, Os, Ir, Pt, Au, Si and Al. As concrete compositions of the pinned layer 36, Co/Ru/Co, CoFe/Ru|CoFe, CoFeNi/Ru|CoFeNi, Co/Cr/Co, CoFe/Cr/CoFe and CoFeNi/Cr/CoFeNi are preferable.

As materials for the pinning layer 38 of the magnetoresistance effect layer 10, FeMn, NiMn, IrMn, RhMn, PtPdMn, ReMn, PtMn, PtCrMn, CrMn, CrAl, TbCo, Ni oxide, Fe oxide, mixture of Ni oxide and Co oxide, mixture of Ni oxide and Fe oxide, Ni oxide/Co oxide (2 layers), Ni oxide/Fe oxide (2 layers), CoCr, CoCrPt, CoCrTa, PtCo, etc. can be employed. PtMn or PtMn to which one or more elements selected from Ti, V, Cr, Co, Cu, Zn, Y, Zr, Nb, Mo, Tc, Ru, Rh, Pd, Ag, Hf, Ta, W, Re, Os, Ir, Pt, Au, Si and Al are added is preferable for the pinning layer 38.

As the protection layer of the magnetoresistance effect layer 10, a single layer or multiple layers each layer of which is composed of one or more materials selected from Ti, V, Cr, Co, Cu, Zn, Y, Zr, Nb, Mo, Tc, Ru, Rh, Pd, Ag, Hf, Ta, W, Re, Os, Ir, Pt, Au, Si, Al and Ni can be employed.

Figure 22:
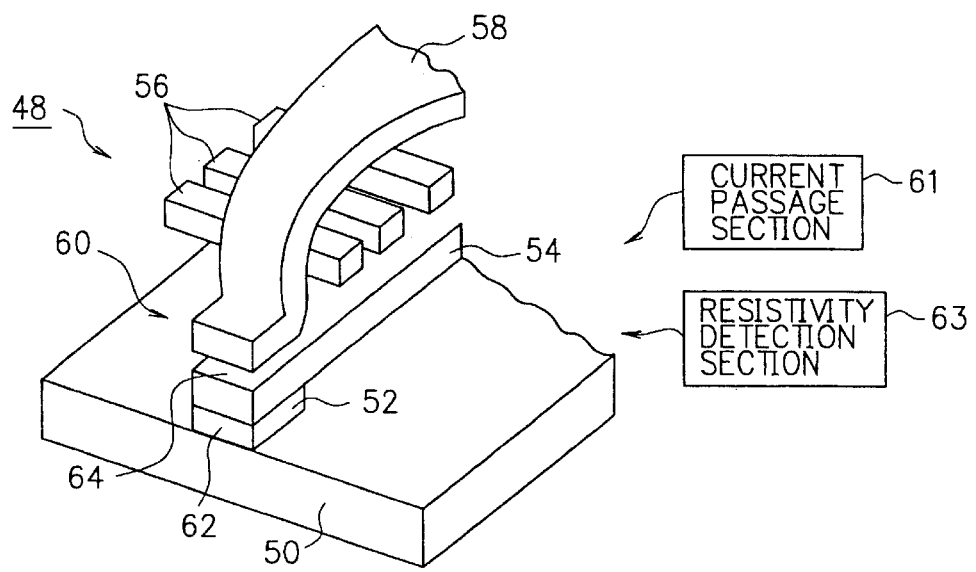
FIG. 22 is a schematic perspective view showing a magnetoresistance magnetic field detection system (a magnetic field detection system employing a magnetoresistance element) in accordance with an embodiment of the present invention.

FIG. 22 is a schematic perspective view showing a magnetoresistance magnetic field detection system (a magnetic field detection system employing a magnetoresistance element) in accordance with an embodiment of the present invention. Referring to FIG. 22, the magnetoresistance magnetic field detection system includes a magnetic recording reproduction head 48, a current passage section 61 and a resistivity detection section 63. The magnetic recording reproduction head 48 includes a reproduction head 52 and a recording head 60 which are formed on a substrate 50. The recording head 60 includes a lower pole 54, a coil 56 and an upper pole 58. Concretely, the reproduction head 52 is implemented by the magnetoresistance element (2, 42, 44, 46, etc.) which has been described above. The following explanation will be given on the assumption that the magnetoresistance element 2 is employed for the reproduction head 52.

An unshown information storage surface of a magnetic recording medium is placed so as to face the ABS (Air Bearing Surface) 62 of the reproduction head 52. Information is magnetically recorded and stored in the information storage surface of the magnetic recording medium by the recording head 60. On the other hand, information stored in the information storage surface is read out by the reproduction head 52 and thereby a signal corresponding to the information is outputted.

As shown in FIG. 22, the ABS 62 of the reproduction head 52 and a magnetic gap 64 of the recording head 60 are placed nearby and in register on a substrate 50 (slider), therefore, the recording head 60 and the reproduction head 52 can simultaneously be placed on the same track on the magnetic recording medium.

Between the lower electrode layer 8 and the upper electrode layer 12 of the reproduction head 52 (magnetoresistance element 2), a sense current is passed by the current passage section 61 (shown in FIG. 22) through unshown wires. Due to variations in leak magnetic field from information storage units of the magnetic recording medium, electrical resistance of the magnetoresistance element 2 changes and thereby the amount of the sense current passing through the magnetoresistance element 2 changes. The resistivity detection section 63 shown in FIG. 22 detects the change of resistivity of the magnetoresistance element 2 based on the change of the sense current, and the result of the detection is used as the information read out from the magnetic recording medium.

The magnetic recording reproduction head 48 (magnetoresistance magnetic field detection system) of this embodiment is implemented by use of the magnetoresistance element 2 (2, 42, 44, 46, etc.) in accordance with the present invention. Therefore, manufacturing yield of the magnetic recording reproduction head 48 can be improved and cost can be reduced due to the high manufacturing yield of the magnetoresistance element (2, 42, 44, 46, etc.). High performance of the magnetic recording reproduction head 48 can be realized by the high performance and reliability of the magnetoresistance element (2, 42, 44, 46, etc.) without the short between the lower electrode layer 8 and the upper electrode layer 12.

Figure 23:
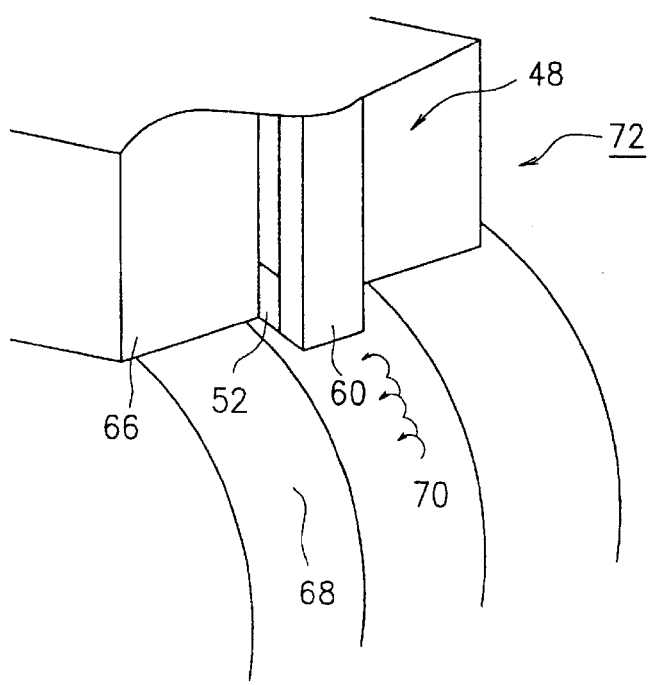
FIG. 23 is a schematic perspective view showing a magnetic recording system in accordance with an embodiment of the present invention.

FIG. 23 is a schematic perspective view showing a magnetic recording system in accordance with an embodiment of the present invention, in which the same reference characters as those of FIG. 22 designate the same parts to those of FIG. 22. The magnetic recording system 72 shown in FIG. 23 is concretely, an HDD (Hard Disk Drive), an FDD (Floppy-Disk Drive), etc., in which the magnetic recording reproduction head 48 of FIG. 22 is installed on a substrate 66. The reproduction head 52 and the recording head 60 of the magnetic recording reproduction head 48 are placed near a magnetic recording medium 68 so that the ABS 62 and the magnetic gap 64 (see FIG. 22) will face the surface of the magnetic recording medium 68. Concretely, the distance between the heads and the surface of the magnetic recording medium 68 is set between 0 μm and 0.2 μm.

The magnetic recording medium 68, which is formed in the shape of a disk in this embodiment, is spun at a high speed, while the substrate 66 (magnetic recording reproduction head 48) is driven (by an unshown driving section) in the radial direction of the magnetic recording medium 68 and is placed on a selected track. The reproduction head 52 reads magnetic information stored in the magnetic recording medium 68 by detecting a leak magnetic field 70 from the surface of the magnetic recording medium 68, and outputs a corresponding electric signal.

The present inventors experimentally manufactured an HDD (Hard Disk Drive) as the above magnetic recording system 72. The magnetic recording system 72 has 3 magnetic recording mediums 68 (disks 68) on its base. On the back of the base, a head driving circuit, signal processing circuit and an I/O interface were installed. Connection of the magnetic recording system 72 to outside was implemented by a 32-bit bus. On each sides of each magnetic recording medium 68, a magnetic recording reproduction head 48 manufactured according to the present invention was placed (total: 3×2=6 pieces).

The magnetic recording system 72 is also provided with a rotary actuator and a driving/control circuit for the rotary actuator for driving the magnetic recording reproduction head 48, and a spindle motor for spinning the disks 68.

The diameter of each disk (magnetic recording medium) 68 is 46 mm, and an area on each surface of the disk corresponding to diameters from 10 mm to 40 mm (radius: 5 mm~20 mm) is used as the information storage surface. Buried servo is employed and each disk does not have a servo surface, therefore, high-density recording is realized. The magnetic recording system 72 can directly be connected to a personal computer as an external storage device. The I/O interface is provided with cache memory and can cope with a bus whose data transfer rate is between 5 MB/s and 20 MB/s. A large-capacity magnetic recording system can also be constructed by connecting two or more of the magnetic recording systems 72 and providing them with an external controller.

The magnetic recording system 72 of this embodiment is implemented by use of the magnetic recording reproduction head 48 of the above embodiment. Therefore, the same effects as those of the magnetic recording reproduction head 48 of the above embodiment can be obtained by the magnetic recording system 72. Concretely, high manufacturing yield, low cost, and high performance and reading sensitivity of the magnetic recording system 72 can be attained.

In the following, concrete examples of materials, dimensions, conditions, etc. concerning a magnetic recording reproduction head 48 which has been manufactured by the present inventors by way of experiment will be described. In the following explanation, expressions like "$Ni_{82}Fe_{18}$" denote chemical make-up in terms of "at %".

As the magnetoresistance effect layer 10, a layered magnetic structure:/Ta (3 nm)/$Ni_{82}Fe_{18}$ (4 nm)/$Co_{90}Fe_{10}$ (0.5 nm)/Al oxide (0.7 nm)/$Co_{90}Fe_{10}$ (2 nm)/Ru (0.6 nm)/$Co_{90}Fe_{10}$ (1.5 nm)/$Pt_{46}Mn_{54}$ (12 nm)/Ta (3 nm) was formed and used.

After the formation of the magnetoresistance effect layer 10, the magnetoresistance effect layer 10 was heat-treated at 250° C. for 5 hours applying a 500 Oe magnetic field which is perpendicular to a magnetic field which has been used during the deposition of the magnetoresistance effect layer 10. In the patterning of the magnetoresistance effect layer 10 in the trial manufacture, the patterning was stopped in the middle of the non-magnetic layer 34, therefore, the remaining (lower) part of the non-magnetic layer 34 and the free layer 32 were not patterned. The patterning was executed by use of milling equipment of ordinary type, in which the milling was conducted in the direction perpendicular to the magnetoresistance effect layer 10 in a pure Ar atmosphere under a pressure of 0.3 Pa.

As parts of the magnetic recording reproduction head 48, the following materials were used: substrate: 1.2 mm altic ($Al_2O_3$·TiC) on which alumina (10 μm) is deposited <Reproduction Head 52>
  lower shield layer 4: $Co_{89}Zr_4Ta_4Cr_3$ (1 μm)
  lower gap layer 6: alumina (20 nm)
  lower gap thickening layer: alumina (40 nm)
  lower electrode layer 8: Ta (1.5 nm)/ Cu (40 nm)/Ta (3 nm)
  lower electrode thickening layer 9: Ta (1.5 nm)/Au (40 nm)/Ta (3 nm)
  lower electrode anti-erosion/flaking layer 16: (materials shown in FIG. 24) (50 nm)
  insulation layer 35: alumina (40 nm)
  longitudinal bias layer 40: Cr (10 nm)/$Co_{74.5}Cr_{10.5}Pt_{15}$ (24 nm)
  first upper electrode layer 22: Ta (20 nm)
  second upper electrode layer 24: Ta (1.5 nm)/Au (40 nm)/Ta (3 nm)
  second upper electrode thickening layer 25: Ta (1.5 nm)/Au (40 nm)/Ta (3 nm)
  upper gap layer 30: alumina (40 nm)
  upper gap thickening layer: alumina (40 nm)
  upper shield layer 31: (material of the lower pole 54 of the recording head 60 (common pole))

<Recording Head 60>
  common pole underlayer: $Ni_{82}Fe_{18}$ (90 nm)
  common pole: $Ni_{82}Fe_{18}$ (2.5 μm)/$Co_{65}Ni_{12}Fe_{23}$ (0.5 μm)
  magnetic gap 64: alumina (0.2 μm)
  gap thickening layer: alumina (0.7 μm)
  coil underlayer: Cr (30 nm)/Cu (150 nm)
  coil 56: Cu (4.5 μm)

upper pole underlayer: Ti (10 nm)/ $Co_{65}Ni_{12}Fe_{23}$ (0.1 μm)
upper pole 58: $Co_{65}Ni_{12}Fe_{23}$ (0.5 μm)/$Ni_{82}Fe_{18}$ (3.5 μm)
terminal underlayer: Cr (30 nm)/Cu (150 nm)
terminal: Cu (50 μm)
overcoat: alumina (52 μm)
Au terminal underlayer: Ti (10 nm)/$Ni_{82}Fe_{18}$ (0.1 μm)
Au terminal: Au (3 μm)

The reproduction head 52 and the recording head 60 were formed as follows:

[1] Reproduction Head 52 substrate cleaning→lower shield layer 4 deposition and annealing→alignment mark formation (photoresist layer formation→patterning→photoresist layer removal)→lower shield layer 4 patterning (photoresist layer formation→tapering→photoresist layer removal)→lower gap layer 6 formation (photoresist layer formation→lower gap layer 6 deposition→lift-off)→lower gap thickening layer formation (photoresist layer formation→lower gap thickening layer deposition→lift-off)→lower electrode layer 8 formation (lower electrode layer 8 deposition→photoresist layer formation→milling (remaining photoresist layer is not removed at this stage))→lower electrode anti-erosion/flaking layer 16 formation (lower electrode anti-erosion/flaking layer 16 deposition→remaining photoresist layer removal)→lower electrode thickening layer 9 formation (photoresist layer formation→lower electrode thickening layer 9 deposition→lift-off)→longitudinal bias layer 40 formation (photoresist layer formation→longitudinal bias layer 40 deposition→lift-off)→formation of magnetoresistance effect layer 10 and first upper electrode layer 22 (magnetoresistance effect layer 10 deposition→first upper electrode layer 22 deposition→photoresist layer formation→milling to reach the underlayer of the magnetoresistance effect layer 10 (at this stage, materials removed by the milling redeposits on side edges of the magnetoresistance element 2)→adjustment milling for removing the redeposited materials on the side edges of the magnetoresistance element 2)→adjustment milling for removing the redeposited materials on the ABS 62 and the opposite edge of the magnetoresistance element 2→insulation layer 35 formation (insulation layer 35 deposition→lift-off)→formation of opening in insulation layer 35 and barrier layer (non-magnetic layer 34 that is non-metal) (photoresist layer formation→milling→photoresist layer removal)→second upper electrode layer 24 formation (photoresist layer formation→second upper electrode layer 24 deposition→lift-off)→pole height monitor formation (photoresist layer formation→pole height monitor layer deposition→lift-off)→second upper electrode thickening layer 25 formation (photoresist layer formation→second upper electrode thickening layer 25 deposition→lift-off)→upper gap layer 30 formation (photoresist layer formation→upper gap layer 30 deposition→lift-off)→upper gap thickening layer formation (photoresist layer formation→upper gap thickening layer deposition→lift-off)

[2] Recording Head 60 common pole formation (underlayer deposition→frame photoresist layer formation→common pole plating→cover photoresist layer formation→chemical etching→underlayer removal)→pole height filler photoresist→gap layer formation→gap thickening layer formation (photoresist layer formation→gap thickening layer deposition→lift-off)→PW (i.e. pole for magnetically connecting the upper pole 58 and the common pole) formation (photoresist layer formation→milling→photoresist layer removal)→SC1 photoresist (i.e. first photoresist for ensuring insulation of the coil 56) formation→coil 56 formation (underlayer deposition→photoresist layer formation→coil plating→chemical etching→underlayer removal)→SC2 photoresist (i.e. second photoresist for ensuring insulation of the coil 56) formation→gap adjustment milling→upper pole 58 formation (underlayer deposition→frame photoresist layer formation→upper pole 58 plating→plate annealing→underlayer removal→cover photoresist layer formation→chemical etching→underlayer removal)→ terminal formation (underlayer deposition→photoresist layer formation→terminal plating→chemical etching→underlayer removal)→overcoat deposition→terminal lapping→Au terminal plating (underlayer deposition→photoresist layer formation→Au terminal plating→underlayer removal)

[3] Post-Treatment row cutting→ABS 62 lapping→DLC deposition on ABS 62→slider shaping→attachment to suspension Information recording/reproduction test (manufacturing yield test) was conducted for the magnetic recording reproduction head 48 manufactured as above, using a CoCrTa magnetic recording medium as the magnetic recording medium 68. In the test, the write track width and the read track width were set to 3 μm and 2 μm, respectively. The photoresist setting step for the formation of the coil 56 of the recording head 60 was conducted at 220° C. for 2 hours. The coercivity of the magnetic recording medium 68 was 5.0 kOe and MrT (residual magnetization·thickness) was 0.35 memu/cm$^2$.

A plurality of magnetic recording reproduction heads 48 having the same composition (except for the type (materials) of the lower electrode anti-erosion/flaking layer 16) were manufactured experimentally (100 samples for each type), and manufacturing yield (percentage of samples that passed inspection out of the 100 samples) of each type was obtained and compared. FIG. 24 is a table showing the result of the comparison. The conditions necessary for passing the inspection were: head resistance: 45Ω~50Ω and reproduction output voltage: 3 mV or higher.

In the table of FIG. 24, the "none" denotes samples in which the lower electrode anti-erosion/flaking layers 16 were not formed. The manufacturing yield of the "none" was as low as 4%, whereas those of other types (having the lower electrode anti-erosion/flaking layer 16) were improved to more than 10-fold without exception.

The manufacturing yield varied between 62% and 86% depending on the materials of the lower electrode anti-erosion/flaking layer 16. However, the variation can be regarded as being within the dispersion caused by variations in manufacturing conditions, and thus it is difficult to judge from the result which material is the best for the lower electrode anti-erosion/flaking layer 16. However, the difference between the "none" and other samples (having the lower electrode anti-erosion/flaking layer 16) is evident (more than 10-fold), and thus the effects of the lower electrode anti-erosion/flaking layers 16 are obvious.

Therefore, in the above trial manufacture, the erosion/flaking of the edge 20 of the lower electrode layer 8 (Ta/Cu/Ta) in the photoresist removal step could be prevented by the formation of the lower electrode anti-erosion/flaking layer 16 according to the present invention, thereby the manufacturing yield could be improved dramatically.

The present inventors also conducted another manufacturing yield test, in which a plurality of magnetic recording reproduction heads 48 having the same composition (except for the type (materials) of the lower electrode layer 8) were manufactured experimentally, and manufacturing yield (percentage of samples which passed inspection) of each type was obtained and compared. In the test, the lower electrode anti-erosion/flaking layer 16 was implemented by an Al oxide layer (50 nm) and other parts (layers) were implemented by the aforementioned compositions. The composition of the lower electrode layer 8 was fixed to: Ta (1.5 nm)/"lower electrode material" (40 nm)/Ta (3.0 nm), and the "lower electrode material" was changed. FIG. 25 is a table showing the result of the second manufacturing yield test, in which the manufacturing yield was very high (68%~86%) in all cases. Vulnerability to the erosion/flaking due to the release agent containing the dissolved photoresist actually varies depending on the "lower electrode materials", however, the edge 20 of the lower electrode layer 8 was protected by the lower electrode anti-erosion/flaking layer 16 from the erosion/flaking and thereby deterioration of the manufacturing yield could be eliminated in all cases, regardless of the difference of the lower electrode materials.

As set forth hereinabove, in the magnetoresistance element and the manufacturing method of a magnetoresistance element in accordance with the present invention, the lower electrode anti-erosion/flaking layer is formed before the photoresist layer remaining on the patterned lower electrode layer is removed. The lower electrode anti-erosion/flaking layer is formed around the lower electrode layer so that the edge of the lower electrode anti-erosion/flaking layer facing the lower electrode layer will be in contact with the edge of the lower electrode layer.

Therefore, the edge of the lower electrode layer is protected by the lower electrode anti-erosion/flaking layer from being exposed to the release agent containing the dissolved photoresist in the photoresist layer removal step, thereby the increase of roughness of the edge of the lower electrode layer due to the erosion/flaking of the edge in the photoresist removal step can be avoided, and thereby the electrical short between the upper electrode layer and the lower electrode layer can be eliminated. Therefore, a magnetoresistance element of high sensitivity and high performance can be obtained, and manufacturing yield of the magnetoresistance elements can be improved.

The magnetic field detection system and the magnetic recording system in accordance with the present invention is manufactured employing the magnetoresistance element in accordance with the present invention. Therefore, manufacturing yields of the systems can be improved and costs for the systems can be reduced due to the high manufacturing yield of the magnetoresistance element. High performance of the systems can be realized by the high performance and reliability of the magnetoresistance element without the short between the lower electrode layer and the upper electrode layer.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A magnetoresistance element comprising:
   a lower electrode layer which is formed directly on a lower shield layer or on another layer which is formed on the lower shield layer or so as to serve also as the lower shield layer;
   a magnetoresistance effect layer which is formed on part of an upper surface of the lower electrode layer;
   an upper electrode layer which is formed above the lower electrode layer so that part of a lower surface of the upper electrode layer will at least be in contact with an upper surface of the magnetoresistance effect layer;
   a lower electrode anti-erosion/flaking layer which is formed around the lower electrode layer before a photoresist layer remaining on the patterned lower electrode layer is removed so that an edge of the lower electrode anti-erosion/flaking layer facing the lower electrode layer will be in contact with an edge of the lower electrode layer; and
   a longitudinal bias layer that is formed nearby or in contact with the magnetoresistance effect layer for applying a longitudinal bias magnetic field to the magnetoresistance effect layer,
   wherein the longitudinal bias layer is formed so that a part of the longitudinal layer will at least be in contact with the magnetoresistance effect layer.

2. The magnetoresistance element as claimed in claim 1, wherein the lower electrode anti-erosion/flaking layer is formed so that the edge of the lower electrode anti-erosion/flaking layer facing the lower electrode layer will cover the edge of the lower electrode layer.

3. A magnetoresistance element as claimed in claim 1, wherein the upper electrode layer includes:
   a first upper electrode layer which is formed on the magnetoresistance effect layer in almost the same area as that of the magnetoresistance effect layer; and
   a second upper electrode layer which is formed above the lower electrode layer so that part of a lower surface of the second upper electrode layer will be in contact with an upper surface of the first upper electrode layer.

4. A magnetoresistance element as claimed in claim 1, wherein:
   the lower shield layer is formed on a substrate, and the lower electrode layer is formed on part of an upper surface of the lower shield layer.

5. A magnetoresistance element as claimed in claim 1, wherein the lower electrode layer also serves as the lower shield layer.

6. A magnetoresistance element as claimed in claim 1, wherein:
   the lower shield layer is formed on a substrate, and
   a lower gap layer is formed on the lower shield layer, and
   the lower electrode layer is formed on part of an upper surface of the lower gap layer.

7. A magnetoresistance element as claimed in claim 1, further comprising an upper shield layer which is formed on the upper electrode layer.

8. A magnetoresistance element as claimed in claim 1, wherein the upper electrode layer also serves as an upper shield layer.

9. A magnetoresistance element as claimed in claim 1, further comprising:
   an upper gap layer which is formed on the upper electrode layer; and
   an upper shield layer which is formed on the upper gap layer.

10. A magnetoresistance element as claimed in claim 1, wherein the longitudinal bias layer is formed on the upper surface of the lower electrode layer on both sides of the magnetoresistance effect layer.

11. A magnetoresistance element as claimed in claim 1, wherein the lower electrode anti-erosion/flaking layer is implemented by a single layer which is composed of metal, oxide or nitride.

12. A magnetoresistance element as claimed in claim 1, wherein the magnetoresistance effect layer is composed of ferromagnetic tunnel junction layers.

13. A magnetoresistance element as claimed in claim 1, wherein the magnetoresistance effect layer includes:
- a free layer which is formed over the lower electrode layer;
- a non-magnetic layer which is formed over the free layer;
- a pinned layer which is formed over the non-magnetic layer; and
- a pinning layer which is formed over the pinned layer for pinning the direction of magnetization of the pinned layer.

14. A magnetoresistance element as claimed in claim 1, wherein the magnetoresistance effect layer includes:
- a free layer which is formed under the upper electrode layer;
- a non-magnetic layer which is formed under the free layer;
- a pinned layer which is formed under the non-magnetic layer; and
- a pinning layer which is formed under the pinned layer for pinning the direction of magnetization of the pinned layer.

15. A magnetoresistance element comprising:
- a lower electrode layer which is formed directly on a lower shield layer or on another layer which is formed on the lower shield layer so as to serve also as a lower shield layer;
- a magnetoresistance effect layer which is formed on part of an upper surface of the lower electrode layer;
- an upper electrode layer which is formed above the lower electrode layer so that part of a lower surface of the upper electrode layer will at least be in contact with the upper surface of the magnetoresistance effect layer; and
- a lower electrode anti-erosion/flaking layer which is formed around the lower electrode layer before photoresist layer remaining on the patterned lower electrode layers removed so that an edge of the lower electrode anti-erosion/flaking layer facing the lower electrode layer will be in contact with the edge of a lower electrode layer, wherein
  the lower electrode anti-erosion/flaking layer is implemented by a mixture layer which is composed of a mixture of oxide and nitride.

16. A magnetoresistance element comprising:
- a lower electrode layer of which is formed directly on a lower shield layer or on another layer which is formed on the lower shield layer so as to serve also as a lower shield layer;
- a magnetoresistance effect layer which is formed on part of an upper surface of the lower electrode layer;
- an upper layer which is formed above the lower electrode layer so that part of a lower surface of the upper electrode layer will at least be in contact with the upper surface of the magnetoresistance effect layer; and
- a lower electrode anti-erosion/flaking layer which is formed around the lower electrode layer before photoresist layer remaining on the patterned lower electrode layers removed so that an edge of the lower electrode anti-erosion/flaking layer facing the lower electrode layer will be in contact with the edge of a lower electrode layer, wherein
  the lower electrode anti-erosion/flaking layer is implemented by multiple layers each layer which is selected from a metal layer, an oxide layer, a nitride layer and a mixture layer composed of oxide and nitride.

* * * * *